United States Patent
Kawabata et al.

(10) Patent No.: US 10,215,816 B2
(45) Date of Patent: Feb. 26, 2019

(54) MAGNETIC FIELD MEASURING APPARATUS

(71) Applicant: Hitachi, Ltd., Chiyoda-ku, Tokyo (JP)

(72) Inventors: Ryuzo Kawabata, Tokyo (JP); Akihiko Kandori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 294 days.

(21) Appl. No.: 15/100,801

(22) PCT Filed: Dec. 3, 2013

(86) PCT No.: PCT/JP2013/082494
§ 371 (c)(1),
(2) Date: Jun. 1, 2016

(87) PCT Pub. No.: WO2015/083242
PCT Pub. Date: Jun. 11, 2015

(65) Prior Publication Data
US 2016/0313417 A1    Oct. 27, 2016

(51) Int. Cl.
*G01R 33/26* (2006.01)
*H01S 5/0687* (2006.01)
(Continued)

(52) U.S. Cl.
CPC ............ *G01R 33/26* (2013.01); *G02B 27/106* (2013.01); *H01S 3/1303* (2013.01); *H01S 5/0687* (2013.01); *H01S 5/14* (2013.01)

(58) Field of Classification Search
CPC ........ G02B 27/106; H01S 3/1303; H01S 5/14
See application file for complete search history.

(56) References Cited

U.S. PATENT DOCUMENTS

| 4,221,960 A | * | 9/1980 | Maeda | ................... | G02F 1/0121 |
| | | | | | 250/205 |
| 5,208,652 A | * | 5/1993 | Sonobe | .................. | G01C 19/72 |
| | | | | | 356/460 |

(Continued)

FOREIGN PATENT DOCUMENTS

JP   58-163917 A    9/1983
JP   61-233383 A    10/1986
(Continued)

OTHER PUBLICATIONS

Japanese Office Action issued in counterpart Japanese Application No. 2015-551321 dated Dec. 6, 2016 (three pages).
(Continued)

*Primary Examiner* — Jermele M Hollington
*Assistant Examiner* — Alvaro Fortich
(74) *Attorney, Agent, or Firm* — Crowell & Moring LLP

(57) ABSTRACT

The present invention addresses the problem of stabilizing signals in magnetic field measurement using optical pumping. In order to solve the problem, disclosed is a light source apparatus (10) that is characterized in having: a light intensity fluctuation detection circuit (130) that detects intensity fluctuation of light outputted from a laser output unit (11); and an acousto-optic modulator (121) that corrects light intensity on the basis of light intensity fluctuation detected by means of the light intensity fluctuation detection circuit (130) such that the light intensity is constant Furthermore, a magnetic field measuring apparatus of the present invention is characterized in having: one sensor unit that passes therethrough light outputted from a light source unit: and a signal control processor that eliminates the light intensity fluctuation on the basis of two lights passed through the sensor unit.

6 Claims, 13 Drawing Sheets

(51) Int. Cl.
*G02B 27/10* (2006.01)
*H01S 3/13* (2006.01)
*H01S 5/14* (2006.01)

(56) References Cited

U.S. PATENT DOCUMENTS

| | | | | |
|---|---|---|---|---|
| 7,656,154 | B2* | 2/2010 | Kawabata | G01R 33/0354 |
| | | | | 324/244.1 |
| 2009/0232172 | A1* | 9/2009 | Masuda | H01S 3/1392 |
| | | | | 372/32 |
| 2010/0044564 | A1* | 2/2010 | Suziki | G01R 33/282 |
| | | | | 250/306 |
| 2010/0156547 | A1* | 6/2010 | McGuyer | G04F 5/145 |
| | | | | 331/94.1 |
| 2010/0194379 | A1* | 8/2010 | Kurosawa | G01R 15/246 |
| | | | | 324/96 |
| 2010/0327861 | A1 | 12/2010 | Nagasaka | |
| 2011/0095755 | A1 | 4/2011 | Maki | |
| 2011/0110204 | A1* | 5/2011 | Hashizume | G11B 7/08564 |
| | | | | 369/44.23 |
| 2012/0183004 | A1* | 7/2012 | Kupershmidt | H01S 5/0687 |
| | | | | 372/29.011 |
| 2012/0249132 | A1 | 10/2012 | Hokari | |
| 2013/0265042 | A1 | 10/2013 | Kawabata et al. | |
| 2015/0054504 | A1 | 2/2015 | Ichihara et al. | |

FOREIGN PATENT DOCUMENTS

| | | | |
|---|---|---|---|
| JP | 61-275673 | A | 12/1986 |
| JP | 63-158480 | A | 7/1988 |
| JP | 5-50758 | U | 7/1993 |
| JP | 2009-128235 | A | 6/2009 |
| JP | 2009-236599 | A | 10/2009 |
| JP | 2011-7659 | A | 1/2011 |
| JP | 2011-89868 | A | 5/2011 |
| JP | 2012-215499 | A | 11/2012 |
| JP | 2013-205280 | A | 10/2013 |
| WO | WO 2013/150926 | A1 | 10/2013 |

OTHER PUBLICATIONS

International Search Report (PCT/ISA/210) issued in PCT Application No. PCT/JP2013/082494 dated Mar. 11, 2014 with English-language translation (five (5) pages).
Japanese Office Action issued in counterpart Japanese Application No. 2015-551321 dated Jun. 6, 2017 with English-language translation (six (6) pages).

* cited by examiner

MAGNETIC FIELD MEASURING APPARATUS

TECHNICAL FIELD

The present invention relates to a technology of magnetic field measuring apparatus used for magnetic field measurement by optical pumping.

BACKGROUND ART

An optical pumping magnetic field measuring apparatus utilizing magnetic field optical properties of an alkali metal excited by optical pumping, uses as a sensor a glass cell in which an alkali metal gas (for example, potassium, rubidium, cesium or the like) is sealed. During magnetic field measurement, a static magnetic field is applied to this glass cell, and an energy level of the alkali metal in the glass cell is split by the Zeeman effect. Further, during magnetic field measurement, the optical pumping magnetic field measuring apparatus inputs a polarized light (for example, linearly polarized light, circularly polarized light or elliptically polarized light) or a modulated light (intensity-modulated light or phase-modulated light) into the glass cell while the static magnetic field is applied to the glass cell. Then, as a result of the light input, the optical pumping magnetic field measuring apparatus detects a magnetic field in the glass cell by using a spin state of the alkali metal caused in the glass cell.

As a technology related to the optical pumping magnetic field measuring apparatus, a technology described in Patent Document 1 is disclosed. The technology described in Patent Document 1 is to spin polarize the alkali metal in the glass cell by pump light (circularly polarized light) and to detect the magnetic field entering the glass cell by a rotation angle of polarization plane of a probe light (linearly polarized light) inputted into the glass cell in a direction perpendicular to the pump light.

Further, as the technology related to the optical pumping magnetic field measuring apparatus, a technology described in Patent Document 2 is disclosed. The technology described in Patent Document 2 is to spin polarize the alkali metal in the glass cell by the pump light (circularly polarized light), to generate magnetic resonance in the glass cell by applying an RF (a Radio Frequency) magnetic field to the glass cell, and to detect the ouogneiic field entering the glass cell by the pump light transmitted through the glass cell.

Further, as the technology related to the optical pumping magnetic field measuring apparatus, a technology described in Patent Document 3 is disclosed. The technology described in Patent Document 3 is to cause an electromagnetically induced transparency phenomenon in the alkali metal in the glass cell by a laser beam and to detect the magnetic field entering the glass cell by drive frequency of a light source for causing the electromagnetically induced transparency phenomenon.

Furthermore, as the technology related to the optical pumping magnetic field measuring apparatus, a technology described in Patent Document 4 is disclosed. The technology described in Patent Document 4 is to detect the magnetic field entering the glass cell by using magnetic resonance generated in the RF magnetic field in the same manner as the technology described in Patent Document 2, and to eliminate noises derived from the light source by calculating a difference between lights having passed through two glass cells.

CITATION LIST

Patent Literature

{Patent Document 1}
Japanese Patent Application Publication No. 2009-236599
{Patent Document 2}
Japanese Patent Application Publication No. 2011-007659
{Patent Document 3}
Japanese Patent Application Publication No. 2011-089868
{Patent Document 4}
Japanese Patent Application Publication No. S61-233383

SUMMARY OF INVENTION

Technical Problem

The technology described in Patent Document 1 is to elevate temperature of the glass cell in a zero magnetic field environment to 100° C. or more, and thus to significantly prevent relaxation due to spin exchange collisions of alkali metal atoms, which are spin polarized by the pump light (circularly polarized light), in the glass cell, to perform high sensitivity magnetic field detection. Here, when performing high sensitivity magnetic field detection, in order to stabilize signal of the magnetic field detection, it is necessary that intensity (hereinafter, referred to as light intensity) of light to be used is stable.

In general, the light intensity fluctuates by various physical factors such as fluctuation of current flowing through the light source, vibration under a light source environment, and temperature variation around the light source. When the light intensity fluctuates, the fluctuation is mixed into the signal of the magnetic field detection. Therefore, in order to realize stable and highly sensitive magnetic field detection, it is necessary that the light intensity is stable, as described above. Since the technology described in Patent Document 1 does not consider stable operation of light intensities of both a pump light source and a probe light source, it is not possible to realize stable and highly sensitive magnetic field detection due to influence of intensity fluctuation of the light sources.

The technology described in Patent Document 2 also does not consider the stable operation of the light intensity. The technology described in Patent Document 2 can be operated in a frequency band of low 1/f noise by modulating the RF magnetic field applied to the glass cell. However, since a light intensity fluctuation component is superimposed on modulation frequency of a light having passed through the glass cell, stable and highly sensitive magnetic field detection is prevented. Further, in the technology described in Patent Document 2, since frequency fluctuation of light inputted into the glass cell is converted into light intensity fluctuation in the glass cell, influence of the light intensity fluctuation caused in the glass cell cannot be prevented.

Since the light intensity from the light source is not stable also in the technology described in Patent Document 3, the light intensity fluctuation affects stability and sensitivity of the magnetic field detection in the same manner as the technology described in Patent Document 1 or the technology described in Patent Document 2. Further, in the technology described in Patent Document 3, the light intensity fluctuation caused in the glass cell remains in the same manner as the technology described in Patent Document 2.

The technology described in Patent Document 4 eliminates the light intensity fluctuation derived from the light source by calculating a difference between lights having passed through two glass cells. However, since the light intensity fluctuations caused in respective glass cells are different from each other depending on individual differences or the like of the glass cells, the technology described in Patent Document 4 is insufficient to prevent the light intensity fluctuation. That is, according to the technology described in Patent Document 4, the light intensity fluctuation (noise) derived from the glass cell remains.

The present invention has been made in view of such circumstances, and an object of the present invention is to stabilize signals in magnetic field measurement using optical pumping.

Solution to Problem

Further, another means of the present invention is characterized by eliminating noises derived from a sensor unit based on two lights, which are outputted from a light source unit and have passed through the sensor unit. Other means to solve the above problems will be appropriately described in embodiments.

Advantageous Effects of Invention

According to the present invention, it is possible to stabilize the signals in the magnetic field measurement using optical pumping.

DESCRIPTION OF EMBODIMENTS

Next, embodiments of the present invention (hereinafter referred to as "embodiments") will be described in detail with reference to the accompanying drawings. Here, in consideration of practicality (stability and performance), there is shown an example of using a laser as a light source, however, a lamp may be used as the light source. Note that, in each drawing of the present embodiment, broken line arrows show lights (laser beams), and solid line arrows show electrical signals. Further, a light source apparatus or a magnetic field measuring apparatus shown in the present embodiment is, for example, used for a biomagnetic field measuring apparatus such as a magnetocardiograph, a magnetoencephalograph, or a muscle magnetometer, and for measuring physical properties of magnetic materials.

<<First Embodiment: Light Source Apparatus>>

Figure 1:
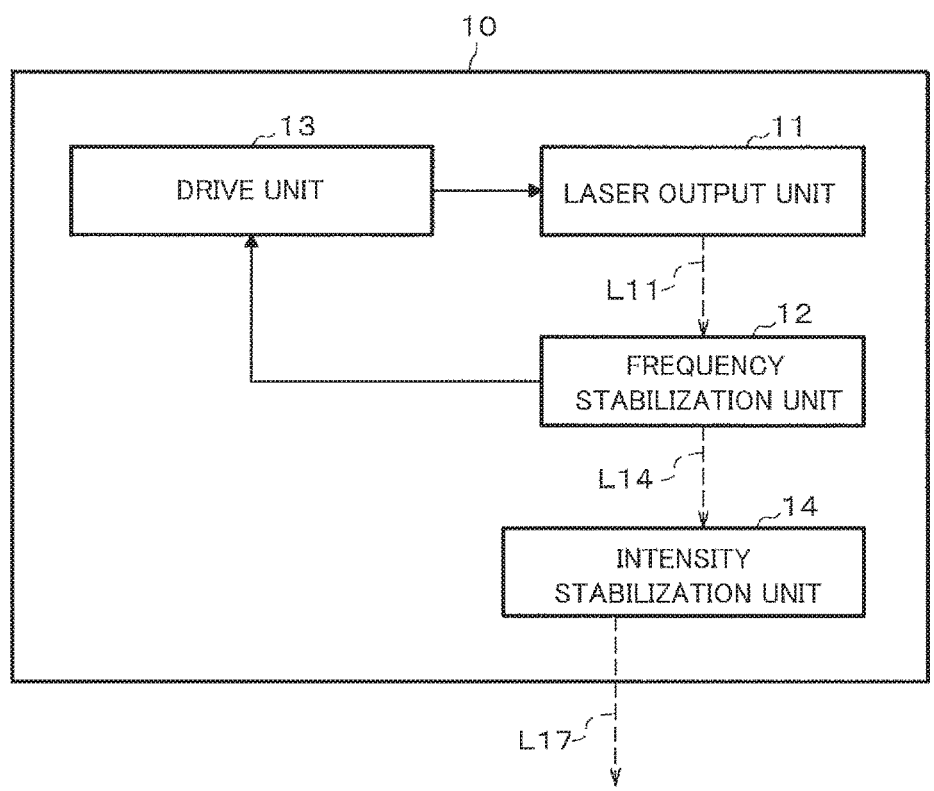
FIG. 1 is a diagram showing a schematic configuration example of a light source apparatus according to a first embodiment.

FIG. 1 is a diagram showing a schematic configuration example of a light source apparatus according to a first embodiment. A light source apparatus 10 includes a laser output unit (light generating unit) 11, a frequency stabilization unit 12, an intensity stabilization unit 14 and a drive unit 13. The laser output unit 11 generates and outputs a laser beam L11 by being applied with voltage. The frequency stabilization unit 12 stabilizes frequency of the laser beam L11 outputted from the laser output unit 11 by controlling the drive unit 13. The intensity stabilization unit 14 stabilizes light intensity of a laser beam L14 outputted from the frequency stabilization unit 12, and outputs a laser beam L17 having a stabilized light intensity. Note that, the intensity stabilization unit 14 is preferably provided as a separate unit in a subsequent stage of the frequency stabilization unit 12. In this way, it is possible to stabilize the light intensity of the laser beam L14 having a frequency stabilized by the frequency stabilization unit 12, thereby outputting the laser beam L17 having a stable frequency and a stable light intensity.

Figure 2:
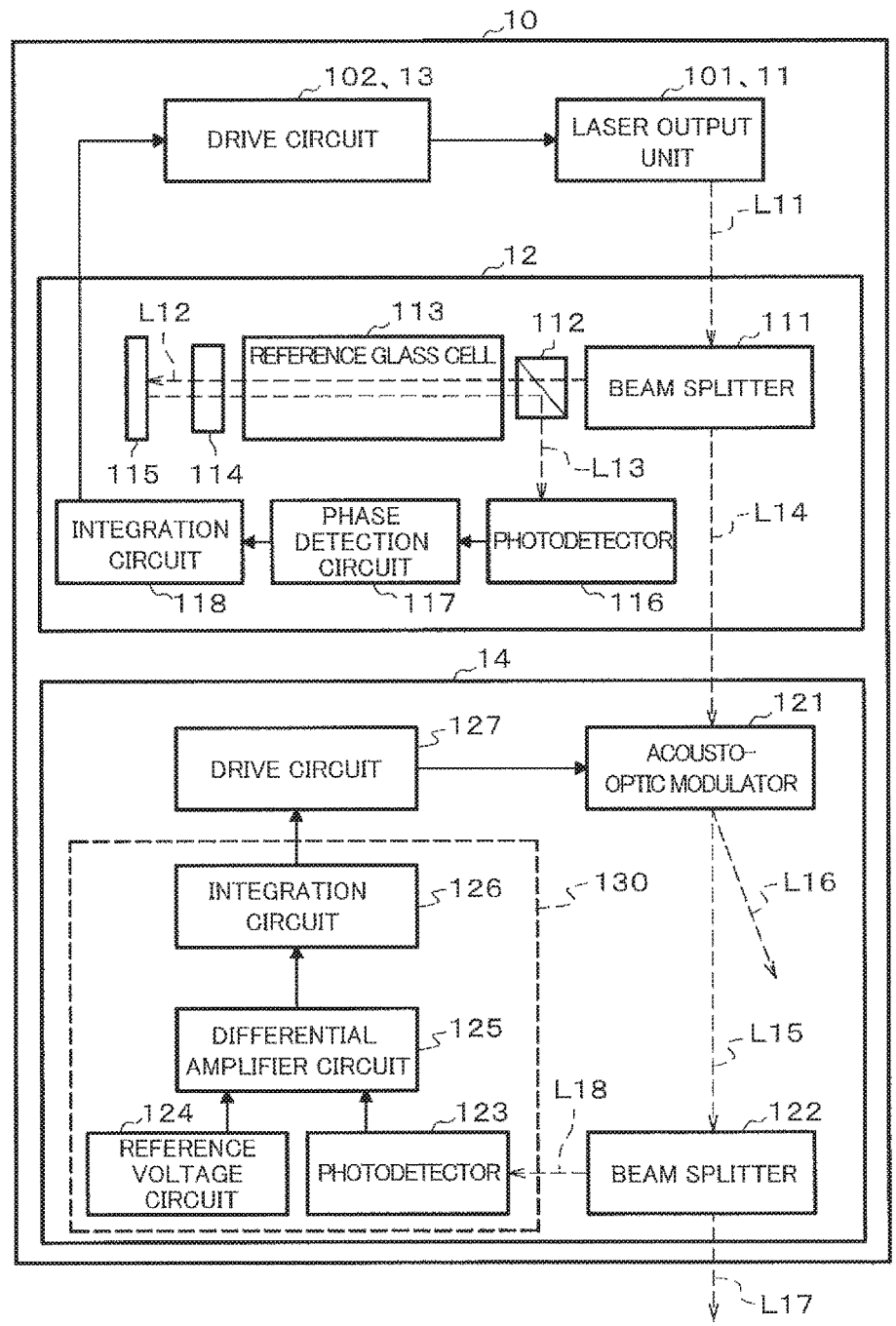
FIG. 2 is a diagram showing a detailed configuration of the light source apparatus according to the first embodiment.

FIG. 2 is a diagram showing a detailed configuration of the light source apparatus according to the first embodiment. The light source apparatus 10 includes a laser output device 101 as the laser output unit 11 and a drive circuit 102 as the drive unit 13. Further, the light source apparatus 10 includes, as components of the frequency stabilization unit 12, a beam splitter 111, a half mirror 112, a reference glass cell 113, a ND (Neutral Density) filter 114, a mirror 115, a photodetector 116, a phase detection circuit 117 and an integration circuit 118. Function of each component will be described below. Here, alkali metal gas is sealed in the reference glass cell 113.

Further, the light source apparatus 10 includes, as components of the intensity stabilization unit 14, an acousto-optic modulator (light intensity fluctuation correction unit, an acousto-optic modulation unit) 121, a beam splitter 122, a photodetector 123, a reference voltage circuit 124, a differential amplifier circuit 125, an integration circuit 126 and a drive circuit (light intensity fluctuation correction unit) 127. Function of each component will be described below. Note that, the photodetector 123, the reference voltage circuit 124, the differential amplifier circuit 125 and the integration circuit 126 constitute a light intensity fluctuation detection circuit (light intensity fluctuation detector) 130 for detecting intensity fluctuation of light outputted from the laser output unit 11. Further, the acousto-optic modulator 121 corrects the light intensity so as to be constant based on the light intensity fluctuation detected by the light intensity fluctuation detection circuit 130. Furthermore, the acousto-optic modulator 121 can change the light intensity outputted by being applied with voltage.

An oscillation frequency of the laser beam L11 includes absorption lines (D1 line, D2 line) of the alkali metal sealed in the reference glass cell 113, and is required to oscillate in a single mode. Further, in particular, spectral line width of the laser beam is preferably equal to or less than an absorption line width of the alkali metal sealed in the reference glass cell 113. As a laser beam which satisfies these conditions and has practicality such as size and cost, a semiconductor laser is suitably used. An external cavity type semiconductor laser having a mirror, a diffraction grating or the like for cavity length adjustment, outside a laser element, or a distributed feedback laser having a cavity length adjustment mechanism inside the laser element, is a candidate for the semiconductor laser to be used. Further, a Distributed Bragg Reflector (DBR) laser or a Vertical Cavity Surface Emitting Laser (VCSEL) is also the candidate.

First, the laser beam L11 is oscillated in the laser output device 101 under control by the drive circuit 102, and is outputted from the laser output device 101.

(Frequency Stabilization)

The laser beam L11 outputted from the laser output device 101 is inputted into the frequency stabilization unit 12, so that frequency stabilization is performed. Hereinafter, a function of the frequency stabilization unit 12 will be described, but the description will be simple because the frequency stabilization unit 12 is a known technology. Here, as a method of frequency stabilization of the laser beam, a method of using the absorption line of the alkali metal or an interferometer as a reference for frequency stabilization is employed.

The laser beam L11 outputted from the laser output device 101 is separated into two laser beams L12, L14 by the beam splitter 111. First, in order to obtain the absorption lines of the alkali metal sealed in the reference glass cell 113, the laser beam L12 passes through the reference glass cell 113 containing only the alkali metal through the half mirror 112. The laser beam L12 excites the alkali metal in the reference glass cell 113 when passing through the reference glass cell 113. Therefore, the laser beam L12 is also referred to as pump light. When the alkali metal is excited, the laser beam L12 absorbs a specific frequency component.

The laser beam L12 having passed through the reference glass cell 113 passes through the ND filter 114, and then is reflected by the mirror 115, passes through the ND filter 114 again, and passes through the reference glass cell 113 again. The laser beam L12, which has been reflected by the mirror 115 and inputted into the reference cell 113 again, is reduced in light intensity by passing through the ND filter 114 twice. The laser beam L12, which has been reflected by the mirror 115 and inputted into the reference cell 113 again, is referred to as laser beam L13. The laser beam L13 is also referred to as a probe light. Note that, the laser beam L13 proceeds along the same optical path as the laser beam L12 in a reverse direction. The laser beam L13 passes through the reference glass cell 113, and then is reflected by the half mirror 112, to be inputted into the photodetector 116.

The photodetector 116 converts the light intensity of the laser beam L13 into an electrical signal. A sine wave having a frequency of an original absorption line of the alkali metal atom is previously inputted to the phase detection circuit 117 as a reference signal. When phase and frequency of the converted electrical signal of the laser beam L13 detected by the photodetector 116 does not match phase and frequency of the e reference signal, the phase detection circuit 117 outputs a difference signal. Then, the integration circuit 118 eliminates high frequency components of the electrical signal outputted from the phase detection circuit 117, and then outputs the electrical signal to the drive circuit 102. The drive circuit 102 performs frequency control of the laser beam L14 outputted from the frequency stabilization unit 12 based on the electrical signal outputted from the integration circuit 118.

As described above, the light intensity of the laser beam L12 (pump light) is strong, and the light intensity of the laser beam L13 (probe light) is sufficiently weaker than that of the laser beam L12 (pump light) by passing through the ND filter 114 twice. The laser beam L12 (pump light) having a strong light intensity saturates excitation of the alkali metal atoms sealed in the reference glass cell 113. In this case, as light absorption frequency characteristics in the reference glass cell 113, the original absorption line should appear, however, a broad absorption spectrum appears due to alkali metal atom oscillation or the like. It is possible to stabilize the frequency by locking the frequency to a peak value of this absorption spectrum, however, the laser beam L13 (probe light) is used here for the sake of more accuracy.

The laser beam L13 (probe light) has a weak light intensity as described above. Therefore, the laser beam L13 (probe light) is not absorbed by the saturated alkali metal atoms in the reference glass cell 113. The spectrum due to the alkali metal atom oscillation in the broad absorption spectrum of the laser beam L12 is absorbed, and thus light other than the original absorption line of the alkali metal atom is absorbed in the laser beam L13. As a result, the spectrum other than the original absorption line of the alkali metal atom in the above-described broad absorption spectrum is more absorbed, and only the original absorption line of the alkali metal atom remains in the laser beam L13. As a result, in spectrum characteristics of the laser beam L13 (probe light), a sharp non-absorption spectrum by the laser beam L14 is generated in the above-described broad absorption spectrum. Accurate frequency stabilization is performed by locking the frequency to the non-absorption spectrum.

(Light Intensity Stabilization)

Next, light intensity stabilization process by the intensity stabilization unit 14 will be described. Note that, frequency stabilization process by the frequency stabilization unit 12 and the light intensity stabilization process by the intensity stabilization unit 14 are performed in parallel. The laser beam L14, which is separated by the beam splitter 111 and is introduced into the intensity stabilization unit 14, is inputted into the acousto-optic modulator 121. When the laser beam L14 is outputted from the acousto-optic modulator 121, it is separated into 0 order beam, 1 order beam, . . . , N order beam (N is an integer) by Bragg diffraction, to be emitted. In general, it is separated into two laser beams of 0 order beam L15 and 1 order beam L16.

Here, the acousto-optic modulator 121 will be described in detail. Voltage can be applied to the acousto-optic modulator 121, and when the voltage is applied to the acousto-optic modulator 121, a piezoelectric element in close contact with an acousto-optic element inside the acousto-optic modulator 121 oscillates at a predetermined frequency in response to the voltage applied thereto. This oscillation is transmitted to the acousto-optic element, and the acousto-optic element itself also oscillates at the frequency.

When the laser beam L14 is inputted into the acousto-optic modulator 121 while the voltage is applied to the acousto-optic modulator 121, the laser beam is separated into 0 order beam L15 and 1 order beam L16, to be outputted from the acousto-optic modulator 121 as described above. When the frequency of the acousto-optic element is F while the voltage is applied to the acousto-optic modulator 121, and a frequency of the laser beam L14 inputted into the acousto-optic modulator 121 is f0, a frequency of the 0 order beam L15 is f0 and a frequency of the 1 order beam L16 is f0+F. Further, when the light intensity of the laser beam L14 inputted into the acousto-optic modulator 121 is A, and the light intensity of the 0 order beam L15 and the light intensity of the 1 order beam L16 outputted from the acousto-optic modulator 121 are respectively A0 and A1, a relationship of A=A0+A1 is established. Values of A0 and A1 can be adjusted by the voltage applied to the acousto-optic modulator 121 (However, the relationship of A=A0+A1 is maintained). Such properties are commonly referred to as acousto-optic effect.

In the present application, such properties of the acousto-optic modulator 121 are utilized. As described above, when the laser beam L14 having a frequency stabilized by the frequency stabilization unit 12 is inputted into the acousto-optic modulator 121, the 0 order beam L15 and the 1 order beam L16 are outputted. Then it is desirable to adjust an angle (a Bragg angle) of the laser beam L14 inputted into the acousto-optic modulator 121 so that the light intensity of the 1 order beam L16 is maximized. In this case, it is possible to easily adjust the angle when there is a position adjustment mechanism for adjusting three axes (X axis, Y axis, Z axis), an angle (θaxis) and the like in the acousto-optic modulator 121 in order to adjust the angle of the laser beam L14 to be inputted.

In the present embodiment, the 0 order beam L15 is used and the 1 order beam L16 is not used. Because, as described above, the laser beam L14 inputted into the acousto-optic modulator 121 and the 0 order beam L15 have the same frequency. The 0 order beam L15 from the acousto-optic modulator 121 is separated by the beam splitter 122 into two of a laser beam L18 for performing intensity stabilization control and a laser beam L17 (sensor excitation beam) used for magnetic field measurement. The laser beam 18 is inputted into the photodetector 123. The photodetector 123 converts light intensity of a control laser beam into an electrical signal.

The differential amplifier circuit 125 calculates a difference between a reference voltage supplied from the reference voltage circuit 124 and a voltage of the electrical signal converted from the light intensity of the laser beam L15 transmitted from the photodetector 123, to be amplified with an appropriate gain. Note that, the reference voltage is a target applied voltage in the acousto-optic modulator 121. Next, the integration circuit 126 cuts frequency components equal to or more than a predetermined frequency out of voltage fluctuations outputted from the differential amplifier circuit 125. That is, the integration circuit 126 has a function of low pass filter. The drive circuit 127 changes the voltage applied to the acousto-optic modulator 121 based on a voltage outputted from the integration circuit 126. In particular, when an inputted voltage (the outputted voltage from the integration circuit 126) is +V1 the drive circuit 127 reduces by V1 the voltage applied to the acousto-optic modulator 121. In contrast, when the inputted voltage is −V1 the drive circuit 127 increases by V1 the voltage applied to the acousto-optic modulator 121. The acousto-optic modulator 121 changes the intensity of the laser beam L15 which is the 0 order beam in response to the voltage applied thereto. That is, the acousto-optic modulator 121 can change by the acousto-optic effect the laser beam L14, which is outputted from the laser output device 101 and is frequency stabilized. That is, the drive circuit 127 drives the acousto-optic modulator 121 by controlling the voltage applied to the acousto-optic modulator 121 based on the light intensity fluctuation detected by the light intensity fluctuation detection circuit 130. As described above, the acousto-optic modulator 121 is inputted with the laser beam L14, which is outputted from the laser output device 101 and is frequency stabilized, and modulates by the acousto-optic effect the intensity of the laser beam L14 inputted thereto, to output the laser beam L14 as the 0 order beam.

That is, the photodetector 123, the reference voltage circuit 124, the differential amplifier circuit 125, the integration circuit 126 and the drive circuit 127 performs a feedback control as a whole so that the voltage applied to the acousto-optic modulator 121 is the reference voltage. In this way, the light source apparatus 10 inputs the beam outputted from the laser output device 101 into the acousto-optic modulator 121, and outputs the 0 order beam outputted from the acousto-optic modulator 121. The light intensity fluctuation detection circuit 130 detects the light intensity fluctuation based on the 0 order beam outputted from the acousto-optic modulator 121. As a result, the voltage applied to the acousto-optic modulator 121 is constant and the light intensity of the 0 order beam L15 is constant.

Note that, when changing the light intensity to be stabilized, it is possible to change the light intensity by changing the output voltage of the reference voltage circuit 124.

The light source apparatus 10 of the first embodiment detects intensity fluctuation of light outputted therefrom and corrects the light intensity so as to be constant. In this way, it is possible to stabilize the light intensity outputted from the light source apparatus 10, thereby also stabilizing the signal converted from this light. Further, since the light intensity stabilization process according to the first embodiment is performed based on the light intensity of an actual light (a laser beam), it is also possible to eliminate the light intensity fluctuation due to physical vibration. The physical vibration is, for example, such that an installation base of the light source apparatus 10 vibrates.

Further, the light source apparatus 10 of the first embodiment has the acousto-optic modulator 121 as the light intensity fluctuation correction unit, and detects the light intensity fluctuation based on the 0 order beam outputted from the acousto-optic modulator 121. The 0 order beam from the acousto-optic modulator 121 has a property of outputting the same frequency as the beam inputted (laser beam L14), and thus it is possible to use the laser beam L17 outputted from the light source apparatus 10 for the magnetic field measurement without adjusting the frequency or other settings.

Furthermore, since the light source apparatus 10 of the first embodiment has the frequency stabilization unit 12, it is possible to stabilize the frequency of the light (laser beam L17) outputted. Since the intensity stabilization unit 14 is provided in the subsequent stage of the frequency stabilization unit 12, it is possible to prevent the light intensity fluctuation caused in the frequency stabilization unit 12 from being superimposed on the beam (laser beam L17) outputted.

[Magnetic Field Measuring Apparatus]

Next, a magnetic field measuring apparatus will be described.

<<Second Embodiment>>

Figure 3:
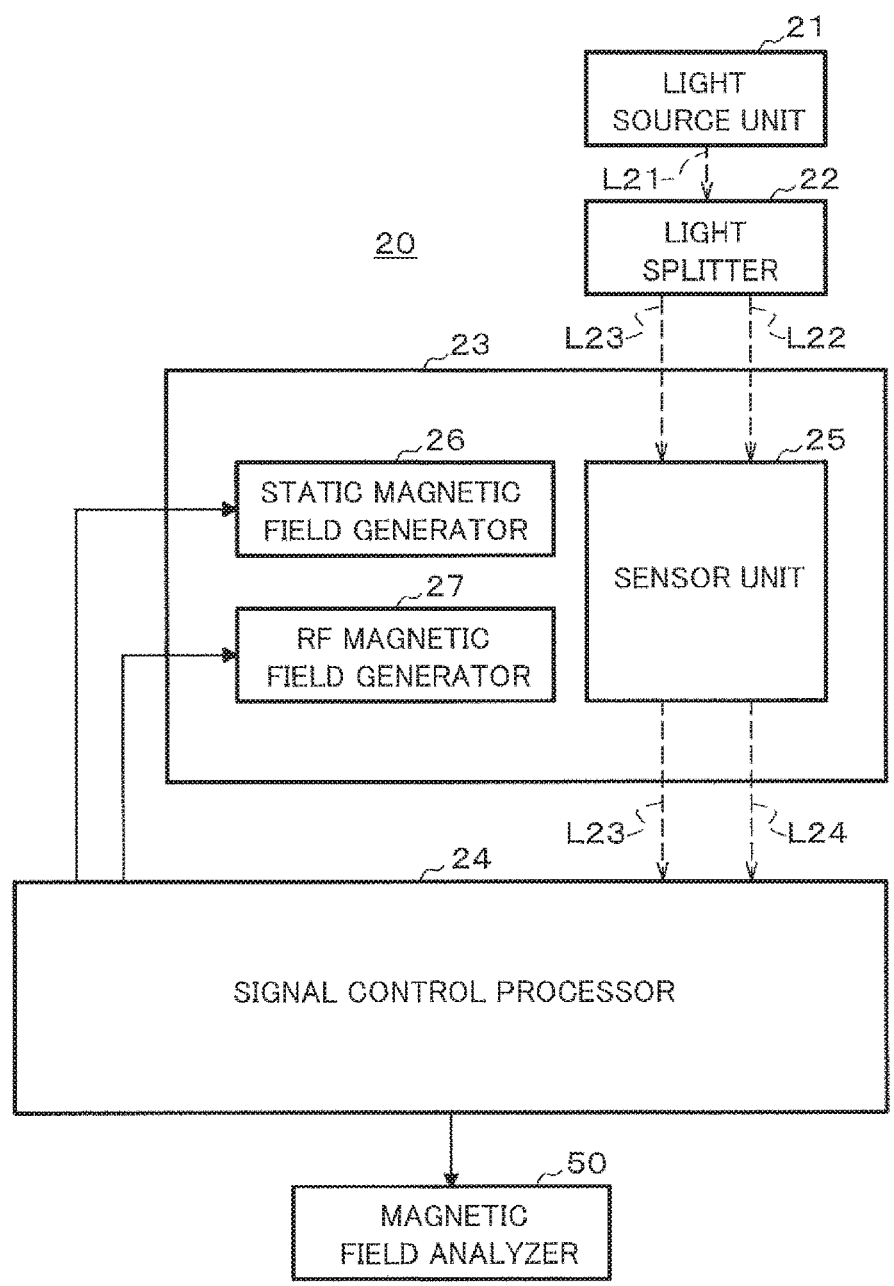
FIG. 3 is a diagram showing a configuration example of a magnetic field measuring apparatus according to a second embodiment.

The magnetic field measuring apparatus according to a second embodiment of the present invention will be described with reference to FIGS. 3 to 5. A magnetic field measuring apparatus 20 according to the second embodiment is for detecting a magnetic field applied to a sensor unit 25 by using light-RF double resonance generated in an RF magnetic field. FIG. 3 is a diagram showing a configuration example of the magnetic field measuring apparatus according to the second embodiment. The magnetic field measuring apparatus 20 includes a light source unit 21, a light splitter 22, the sensor unit 25, a static magnetic field generator 26, an RF magnetic field generator 27, a signal control processor 24 and a magnetic field analyzer 50. The light source unit 21 is for outputting the light, and it is desirable to use the light source apparatus 10 of the first embodiment, however, it may not be used. The light splitter 2 splits a laser beam L21 outputted from the light source unit 21 into two of a laser beam L22 and a laser beam L23.

The sensor unit 25 for passing therethrough the light outputted from the light source unit 21, the static magnetic field generator 26, and the RF magnetic field generator 27 are arranged in a magnetic field shield 23. A static magnetic field generated by the static magnetic field generator 26 and an RF magnetic field generated by the RF magnetic field generator 27 are applied to the sensor unit 25. Further, a measurement object (not shown) is in the vicinity of the sensor unit 25, and a magnetic field generated from the measurement object is also applied to the sensor unit 25. The laser beam L22 split by the light splitter 22 passes through the sensor unit 25, so as to become a laser beam L24 having information of the magnetic field generated from the measurement object and a light intensity fluctuation, that is, a noise, derived from the sensor unit 25. Note that, the lnsor beam L23 has a noise component derived from the sensor unit 25. These will be described below.

The signal control processor 24 eliminates the noise (light intensity fluctuation) derived from the sensor unit 25 from an electrical signal obtained from the laser beam 124 based on the laser beams L23, L24 having passed through the sensor unit 25. Further, the signal control processor 24 transmits the electrical signal required for magnetic field analysis to the magnetic field analyzer 50. Furthermore, the signal control processor 24 supplies a constant current to the static magnetic field generator 26, and controls a frequency of the RF magnetic field in the RF magnetic field generator 27 based on the signal obtained by eliminating the noise. Then, the magnetic field analyzer 50 performs the magnetic field analysis based on the electrical signal, which is transmitted from the signal control processor 24 and is required for the magnetic field analysis. Note that, the magnetic field analyzer 50 may be a separate device from the magnetic field measuring apparatus 20.

Here, it is in use permalloy having a high magnetic permeability as the magnetic field shield 23. Further, a size of the magnetic field shield 23 depends on the measurement object. For example, when measuring a biomagnetic field from human heart or brain, the size of the magnetic field shield 23 will be capable of covering a human body.

Next, each component in FIG. 3 will be described in detail. First, configuration of the magnetic field measuring apparatus 20 will be briefly described with reference to FIGS. 4 and 5, and then detailed function of each component will be described. FIG. 4 is a diagram showing a detailed configuration of the magnetic field measuring apparatus according to the second embodiment, and FIG. 5 is a diagram showing a detailed configuration of a sensor device according to the second embodiment. As shown in FIG. 4, the magnetic field measuring apparatus 20 has a light source apparatus 201 which is the light source unit 21. As described above, the light source apparatus 201 is preferably the light source apparatus 10 of the first embodiment, but may not be. The light splitter 22 has, for example, a beam splitter 202 and a plurality of mirrors 203.

A sensor device 211 is disposed inside the magnetic field shield 23 along with a magnetic field source which is the measurement object. Further, inside the magnetic field shield 23, a static magnetic field generator 212, which applies a static magnetic field in a direction forming an angle of 45 degrees to an optical axis of the laser beam inputted from the light source apparatus 201, is disposed in a sensor glass cell 223 (FIG. 5) in the sensor device 211. Furthermore, an RF magnetic field generator 213, which generates an oscillating magnetic field in a direction perpendicular to the static magnetic field generated by the static magnetic field generator 212, is disposed inside the magnetic field shield 23.

Here, the RF magnetic field generator 213 is also a coil similarly to the static magnetic field generator 212, and is preferably a Helmholtz coil which is disposed sandwiching the sensor glass cell 223. A function of the RF magnetic field generator 213 is to supply the oscillating magnetic field having an RF frequency precisely controlled by an oscillator circuit 237 of the signal control processor 24.

Further, the signal control processor 24 includes two photodetectors (conversion units) 231, 232, a differential amplifier circuit (differential unit) 233, a filter circuit 234, a phase detection circuit 235, a loop filter circuit 236 and the oscillator circuit 237. These functions will be described below. Then, the signal control processor 24 includes a constant current source 238 for supplying a precisely controlled constant current to the static magnetic field generator 212.

Figure 5:
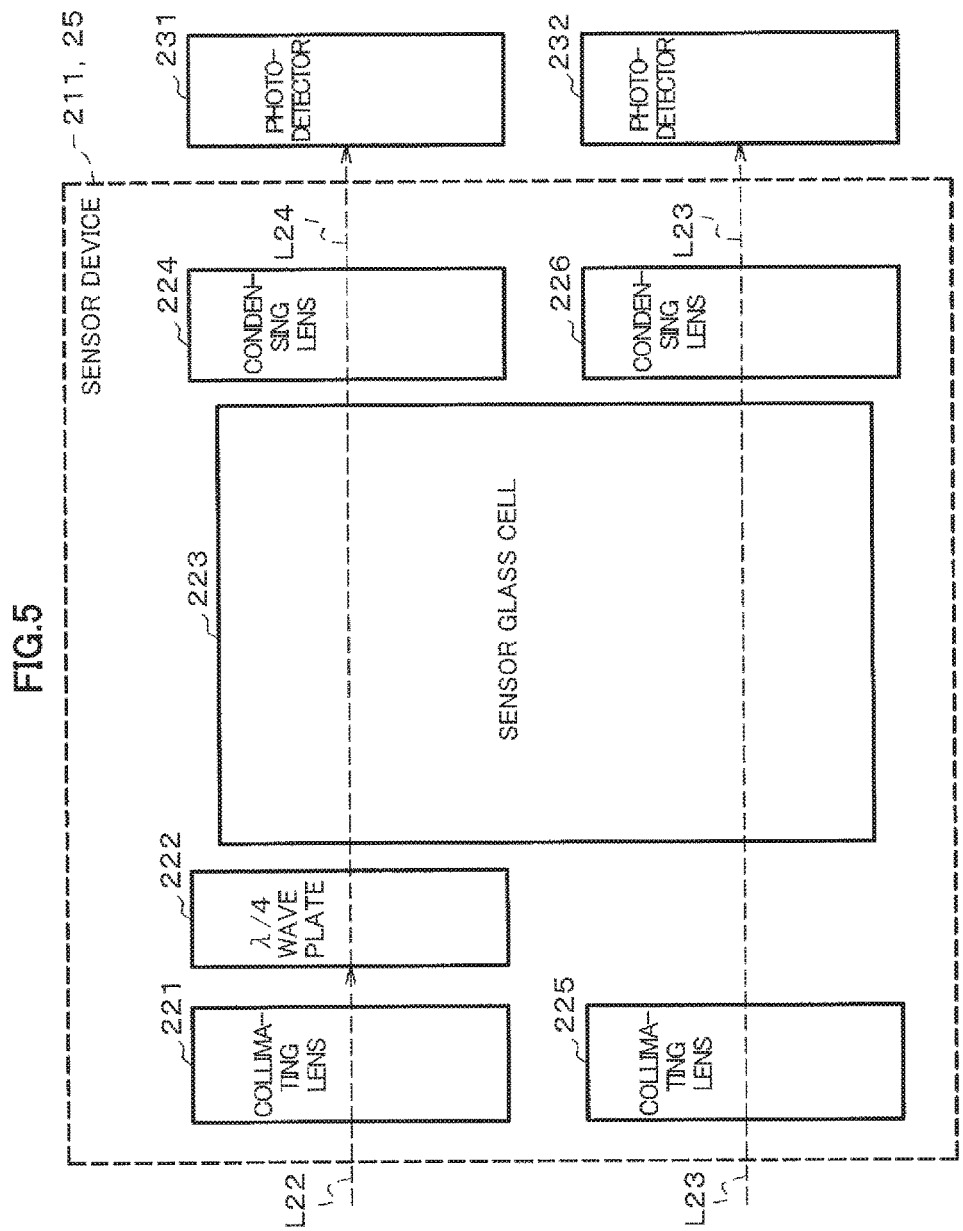
FIG. 5 is a diagram showing a detailed configuration of a sensor device according to the second embodiment.

Further, as shown in FIG. 5, the sensor device 211 includes collimating lenses 221, 225, a λ/4 wave plate (circular polarization unit) 222, the sensor glass cell 223 and condensing lenses 224, 226. Here, the alkali metal gas is sealed in the sensor glass cell 223.

Hereinafter, function of each device will be described in detail with reference to FIGS. 4 and 5. The laser beam L21 outputted from the light source apparatus 201 is a laser beam which contains a wavelength of the absorption line (D1 line or D2 line) of the alkali metal sealed in the sensor glass cell 223.

Figure 4:
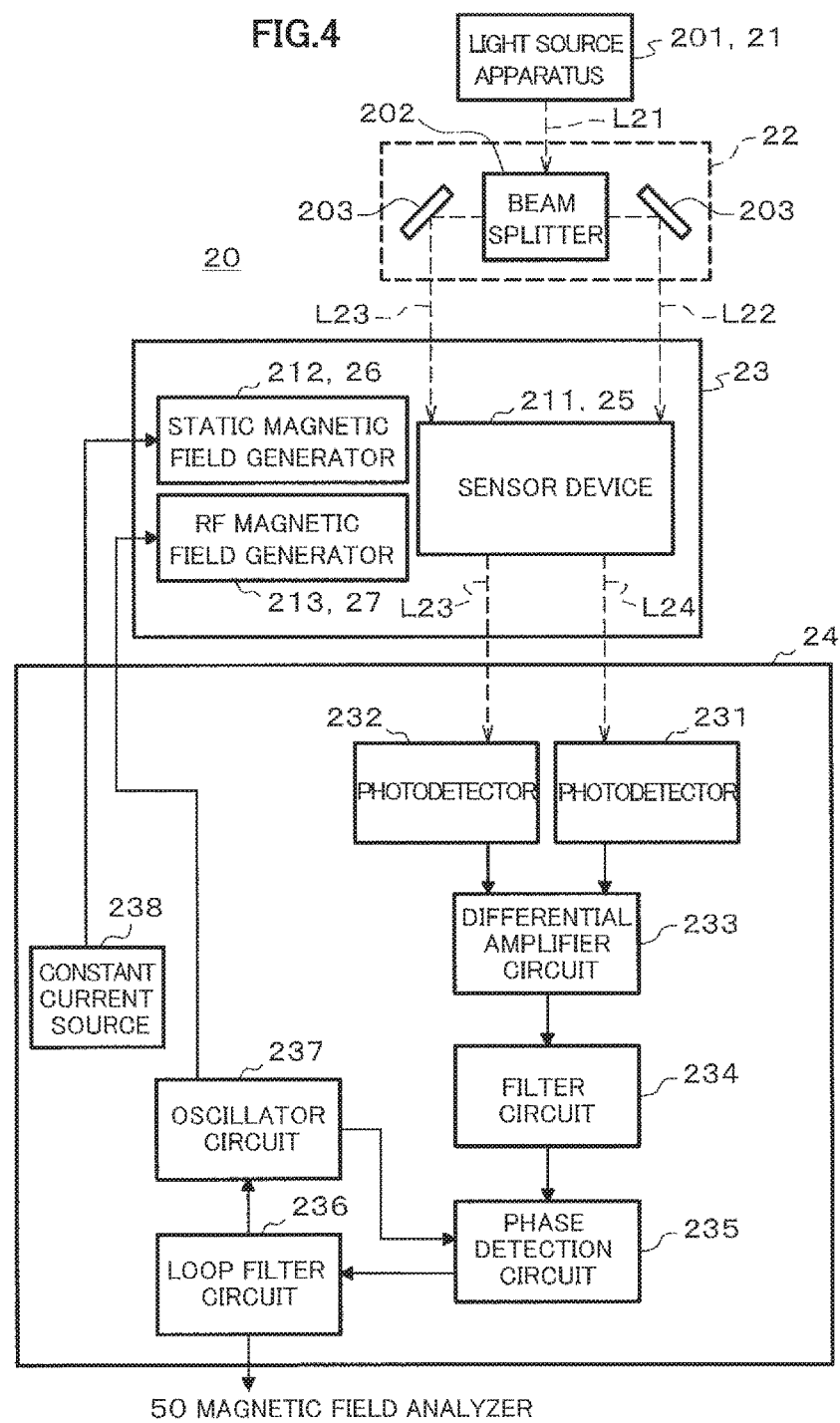
FIG. 4 is a diagram showing a detailed configuration of the magnetic field measuring apparatus according to the second embodiment.

As shown in FIG. 4, the laser beam L21 from the light source apparatus 201 is split into two laser beams L22, L23 by the beam splitter 202 of the light splitter 22 so as to have the same light intensity with each other. The split laser beams L22, L23 become laser beams traveling parallel so as not to overlap each other by the mirrors 203, to be inputted into the sensor device 211.

As shown in FIG. 5, the sensor glass cell 223 is provided in a subsequent stage of the λ/4 wave plate 222, while the alkali metal gas is sealed therein, and the two lights (laser beams L22, L23) split by the light splitter 22 (FIG. 4) are inputted thereto. As shown in FIG. 5, the laser beam L22, which is one laser beam out of the two laser beams L22, L23 inputted from the light splitter 22, is inputted into the sensor glass cell 223 through the collimating lens 221 and the λ/4 wave plate 222. The laser beam L22 becomes a parallel light through the collimating lens 221, and becomes the laser beam L24 of circularly polarized light by the λ/4 wave plate 222, to be inputted into the sensor glass cell 223. The parallel light collimated by the collimating lens 221 means a light which does not diffuse nor converge.

Further, the laser beam L23 is introduced into the sensor glass cell 223 through the collimating lens 225. The laser beam L23 becomes a parallel light through the collimating lens 225 and is inputted into the sensor glass cell 223 in a non-polarized state.

The laser beams L24, L23, which have passed through the sensor glass cell 223, are respectively condensed by the condensing lenses 224, 226, and are respectively inputted into the photodetectors 231, 232 of the signal control processor 24. The photodetectors 231, 232 convert respective intensities of the two lights (laser beams L24, L23), which have passed through the sensor glass cell 223, into electrical signals.

Here, the laser beams L23, L24 are inputted in a parallel state into the sensor glass cell 223. Further, the laser beams L23, L24 have the same light intensity and the same wavelength of light, because they are outputted from the same light source apparatus 201 (FIG. 4). As shown in FIG. 4, the electrical signals respectively from the photodetectors 231, 232 are calculated in differences by the differential amplifier circuit 233, to be amplified with an appropriate gain. Here, since the electrical signals respectively from the photodetectors 231, 232 are calculated in differences by the differential amplifier circuit 233, the laser beam L24 of circularly polarized light is subtracted by the laser beam L23 of non-polarized light.

Here, it is assumed that the laser beam L23 of non-polarized light is a laser beam having substantially only noise component. Therefore, the differential amplifier circuit 233 subtracts the electrical signal derived from the laser beam L23 of non-polarized light from the electrical signal derived from the laser beam L24 of circularly polarized light. In this way, the noise component in the laser beam L24 is eliminated. In other words, the noise component derived from the sensor glass cell 223 is eliminated from the laser light L24.

The electrical signal outputted from the differential amplifier circuit 233 is adjusted to a bandwidth required for analysis by the filter circuit 234. Meanwhile, the phase detection circuit 235 detects the electrical signal from the filter circuit 234 by using the electrical signal from the oscillator circuit 237 as a reference signal. The loop filter circuit 236 controls the detected electrical signal so as not to oscillate. Further, since the signal outputted from the loop filer circuit 236 is inputted into the oscillator circuit 237, an oscillation frequency of the oscillator circuit 237 is voltage controlled. Then, since the oscillation frequency of the oscillator circuit 237 is inputted into the RF magnetic field generator 213, the frequency of the RF magnetic field of the RF magnetic field generator 213 is feedback controlled. Note that, control of the RF magnetic field generator 213 by the phase detection circuit 235, the oscillator circuit 237 and the loop filter circuit 236 is a known technology. Then, the magnetic field analyzer 50 measures a weak magnetic field generated by the measurement object in the vicinity of the sensor glass cell 223 from an output variation of the loop filter circuit 236 during feedback control.

According to the magnetic field measuring apparatus 20 of the second embodiment, the light intensity fluctuation is eliminated on the basis of the two lights laser beams), which are outputted from the light source unit 21 and have passed through the sensor unit 25. That is, it is possible to eliminate the light intensity fluctuation (noise) derived from the sensor unit 25 by calculating a difference between two lights which have passed through the same sensor unit 25, and by eliminating the light intensity fluctuation. As a result, it is possible to stabilize the signal based on the light (laser beam).

Further, by using the lights outputted from the same light source unit 21, it is possible to eliminate the noise by the lights (laser beams) having the same frequency and the same light intensity, thereby stabilizing the light (laser beam) after noise elimination and eliminating a need to adjust the frequency and the light intensity.

Further, by using the light source apparatus 10 according to the first embodiment as the light source unit 21 (light source apparatus 201), it is possible to have the same effect as the light source apparatus 10 of the first embodiment.

<<Third Embodiment>>

Figure 6:
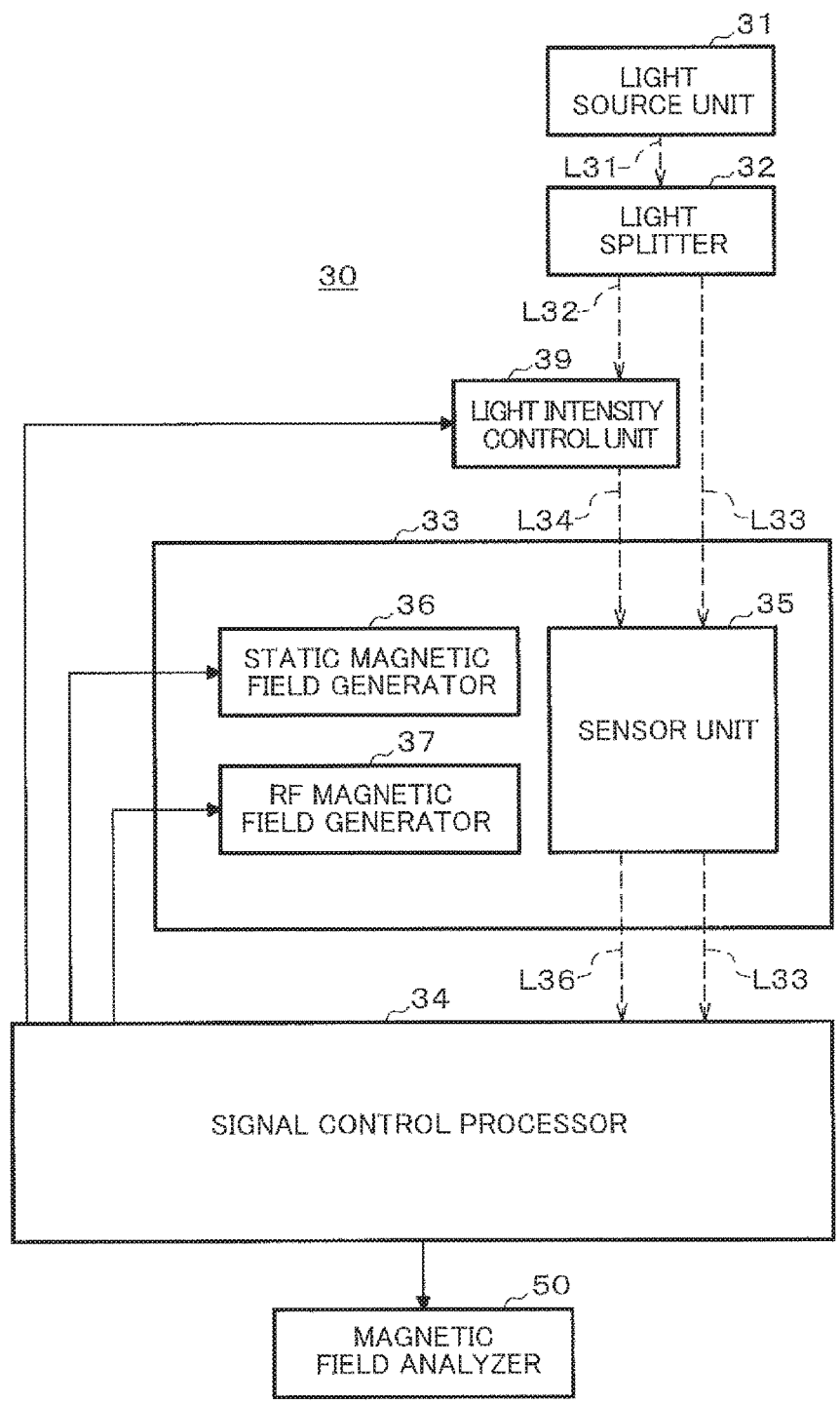
FIG. 6 is a diagram showing a configuration example of a magnetic field measuring apparatus according to a third embodiment.

A magnetic field measuring apparatus according to a third embodiment will be described with reference to FIGS. 6 to 8. The magnetic field measuring apparatus according to the third embodiment is for detecting the magnetic field of the measurement object, which is applied to a sensor unit 35, by using light-RF double resonance generated in the RF magnetic field in the same manner as the second embodiment. FIG. 6 is a diagram showing a configuration example of the magnetic field measuring apparatus according to the third embodiment. The magnetic field measuring apparatus 30 includes a light source unit 31, a light splitter 32, the sensor unit 35, a static magnetic field generator 36, an RF magnetic field generator 37, a signal control processor 34, the magnetic field analyzer 50 and a light intensity control unit 39. The light source unit 31 is for outputting the light, and it is desirable to use the light source apparatus 10 of the first embodiment, however, it may not be used. The light splitter 32 splits a laser beam L31 outputted from the light source unit 31 into two of a laser beam L32 and a laser beam L33. That is, the light splitter 32 splits the laser beam L31 emitted from the same light source unit into the laser beam L32 which is a first light and the laser beam L33 which is a second light. The light intensity control unit 39 converts the laser beam L32 into a laser beam L34 and outputs the laser beam L34 by intentionally superimposing a noise component on the laser beam L32 by a function described below. That is, the light intensity control unit 39 superimposes a noise, which is a fluctuation of an electrical signal transmitted from the signal control processor 34, on the laser beam L32 which is the first light.

The sensor unit 35, the static magnetic field generator 36 and the RF magnetic field generator 37 are arranged in a magnetic field shield 33. The magnetic field shield 33 is the same as the second embodiment, and thus detailed description thereof will be omitted here. A static magnetic field generated by the static magnetic field generator 36 and an RF magnetic field generated by the RF magnetic field generator 37 are applied to the sensor unit 35. Further, the measurement object (not shown) is in the vicinity of the sensor unit 35, and the magnetic field generated from the measurement object is also applied to the sensor unit 35. The laser beam L34 passes through the sensor unit 35, so as to become a laser beam L36 having information of the magnetic field generated from the measurement object and a noise derived from the sensor unit 35. Note that, the laser beam L33 becomes the laser beam L33 having a noise component derived from the sensor unit 35. These will be described below.

The signal control processor 34 transmits the noise component in the laser beam L33 to the light intensity control unit 39. The light intensity control unit 39 superimposes the transmitted noise component on the laser beam L32 by controlling the light intensity of the laser beam L32. Further, the signal control processor 34 controls the frequency of the RF magnetic field in the RF magnetic field generating unit 37 based on an electrical signal obtained from the laser beam L34. Further, the signal control processor 34 supplies a constant current to the static magnetic field generator 36. Furthermore, the signal control processor 34 transmits the electrical signal required for the magnetic field analysis to the magnetic field analyzer 50. Then, the magnetic field analyzer 50 performs the magnetic field analysis based on the electrical signal, which is transmitted from the signal control processor 34 and is required for the magnetic field analysis. Note that, the magnetic field analyzer 50 may be a separate device from the magnetic field measuring apparatus 30.

Next, each component in FIG. 6 will be described in detail. First, configuration of the magnetic field measuring apparatus 30 will be briefly described with reference to FIGS. 7 and 8, and then detailed function of each component will be described, FIG. 7 is a diagram showing a detailed configuration of the magnetic field measuring apparatus according to the third embodiment, and FIG. 8 is a diagram showing a detailed configuration of a sensor device according to the third embodiment. As shown in FIG. 7, the magnetic field measuring apparatus 30 has a light source apparatus 301 which is the light source unit 31. As described above, the light source apparatus 301 is preferably the light source apparatus 10 of the first embodiment, but may not be. The light splitter 32 has a beam splitter 302 and a plurality of mirrors 303. Further, the magnetic field measuring apparatus 30 includes an acousto-optic modulator (acousto-optic modulation unit) 351 as the light intensity control unit 39. The acousto-optic modulator 351 has the same properties as the acousto-optic modulator 121 of the first embodiment (FIG. 2). Furthermore, a sensor device 311 which is the sensor unit 35, a static magnetic field generator 312 which is the static magnetic field generator 36, and an RF magnetic field generator 313 which is the RF magnetic field generator 37, are arranged in the magnetic field shield 33.

Further, the signal control processor 34 includes two photodetectors (conversion units) 331, 341, a reference voltage circuit (reference voltage unit) 332, a differential amplifier circuit 333, an integration circuit 334 and a drive circuit (drive unit) 335. Further, the signal control processor 34 includes an amplifier circuit 342, a filter circuit 343, a phase detection circuit 344, a loop filter circuit 345 and an oscillator circuit 346. These functions will be described below Then, the signal control processor 34 includes a constant current source 347 for supplying a precisely controlled constant current to the static magnetic field generator 312.

Figure 8:
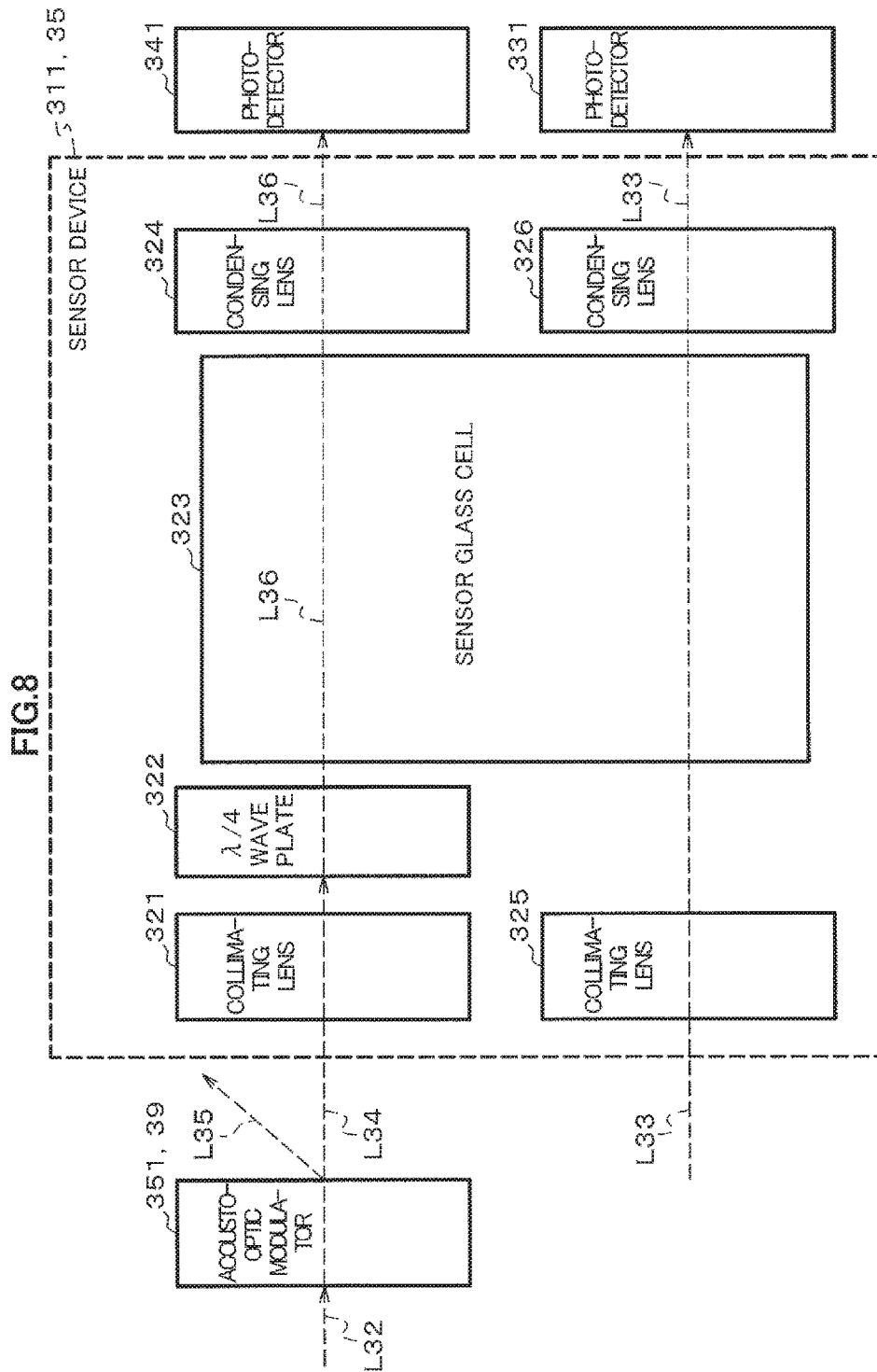
FIG. 8 is a diagram showing a detailed configuration of a sensor device according to the third embodiment.

Further, as shown in FIG. 8, the sensor device 311 includes collimating lenses 321, 325, a λ/4 wave plate (circular polarization unit) 322, a sensor glass cell 323 and condensing lenses 324, 326. Here, as shown in FIG. 8, the sensor glass cell 323 is provided in a subsequent stage of the λ/4 wave plate 322, while the alkali metal gas is sealed therein, and the laser beam L36 which is a circularly polarized first light and the laser light L33 which is the second light, pass therethrough.

Hereinafter, function of each device will be described in detail with reference to FIGS. 7 and 8. The laser beam L31 outputted from the light source apparatus 301 is a laser beam which contains the wavelength of the absorption line (D1 line or D2 line) of the alkali metal sealed in the sensor glass cell 323.

Figure 7:
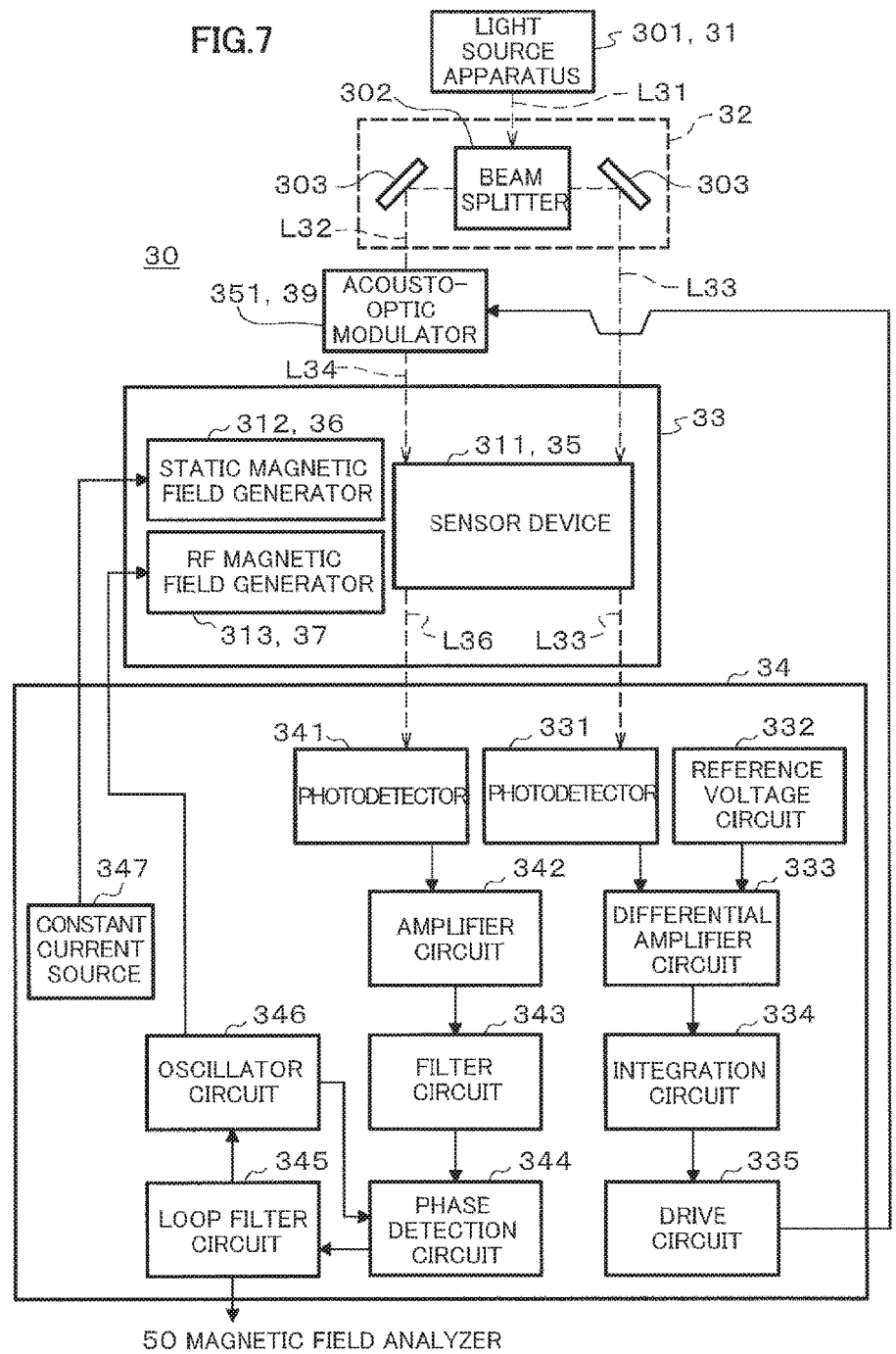
FIG. 7 is a diagram showing a detailed configuration of the magnetic field measuring apparatus according to the third embodiment.

As shown in FIG. 7, the laser beam L31 from the light source apparatus 301 is split into two laser beams L32, L33 by the beam splitter 302 so as to have the same light intensity with each other. The split laser beams L32, L33 become laser beams traveling parallel so as not to overlap each other by the mirrors 303, to be inputted into the sensor device 311.

Among the laser beams L32, L33, the laser beam L32 becomes the laser beam L34, since a noise derived from the sensor glass cell 323 (FIG. 8) is superimposed on the laser beam L32 by controlling the light intensity by the acousto-optic modulator 351. Control of the light intensity by the acousto-optic modulator 351 will be described below.

As shown in FIG. 8, among the laser beams L33, L34, the laser beam L34 is inputted into the sensor glass cell 323 through the collimating lens 321 and the λ/4 wave plate 322. The laser beam L32 is split into 0 order beam L34 and 1 order beam L35 by the acousto-optic modulator 351, and the 0 order beam 134 becomes a parallel light through the collimating lens 321. The 1 order beam L35 is not used by the same reason as the acousto-optic modulator 121 of the first embodiment. The 0 order beam L34 is converted into the laser beam 136 of circularly polarized light by the wave plate 322, and then is inputted into the sensor glass cell 323.

Further, the laser beam L33 is inputted into the sensor glass cell 323 as a cancellation excitation light through the collimating lens 325. The laser beam 133 becomes a parallel light through the collimating lens 325 and is inputted into the sensor glass cell 323 in a non-polarized light state.

The laser beams 133, 136, which have passed through the sensor glass cell 223, are respectively condensed by the condensing lenses 326, 324, and respective light intensities thereof are converted into electrical signals by the photodetectors 331, 341. Conditions when the laser beams L33, L36 are inputted into the sensor glass cell 323 are the same as the second embodiment. That is, the conditions when the laser beams L33, L36 are inputted into the sensor glass cell 323 are that they have the same wavelength of light and the same light intensity, and are inputted in parallel so as not to overlap each other.

As shown in FIG. 7, the electrical signal outputted from the photodetector 341 is amplified with an appropriate gain by the amplifier circuit 342, and is adjusted to a bandwidth required for analysis by the filter circuit 343. The electrical signal outputted from the filter circuit 343 is used for frequency control of the RF magnetic field of the RF magnetic field generator 313, through the phase detection circuit 344, the loop filter circuit 345 and the oscillator circuit 346. Functions of the magnetic field analyzer 50, the phase detection circuit 344, the loop filter circuit 345 and the oscillator circuit 346 are the same as the second embodiment, and thus detailed description thereof will be omitted here.

Meanwhile, the electrical signal outputted from the photodetector 331 is subtracted by a reference voltage supplied from the reference voltage circuit 332, to be amplified with an appropriate gain by the differential amplifier circuit 333. The reference voltage is, for example, previously set to a voltage which can extract only a noise component from the electrical signal outputted from the photodetector 331.

In this way, the electrical signal outputted from the differential amplifier circuit 333 becomes an electrical signal which contains only the noise component derived from the sensor glass cell 323 in the laser beam L33 of non-polarized light. Therefore, the electrical signal outputted from the differential amplifier circuit 333 becomes the electrical signal which contains only the noise component derived from the sensor glass cell 323 (FIG. 8).

The electrical signal outputted from the differential amplifier circuit 333 is controlled to a bandwidth required for analysis by the integration circuit 334, and then is inputted into the drive circuit 335. The drive circuit 335 controls a voltage applied to the acousto-optic modulator 351 based on the electrical signal outputted from the integration circuit 334. That is, the drive circuit 335 applies a variation of the voltage having a reversed plus/minus sign of the fluctuation of the electrical signal, to the acousto-optic modulator 351. In this case, the drive circuit 335 controls the voltage applied to the acousto-optic modulator 351 based on the electrical signal having a reversed plus/minus sign of the electrical signal outputted from the integration circuit 334. The acousto-optic modulator 351 varies the light intensity of the laser beam L32 by the same function as the acousto-optic modulator 121 of the first embodiment.

In this way, the signal having the reversed plus/minus sign of the noise component (noise component derived from the sensor glass cell 323) of the laser beam L33 is superimposed on the laser beam L32. Thus, the laser beam L32 becomes the laser beam L34 which is superimposed with the noise component having the reversed plus/minus sign. When the laser beam L36, which is circularly polarized by the λ/4 wave plate 322, is inputted into the sensor glass cell 323, the noise component having the reversed plus/minus sign in the laser beam L36 and the noise derived from the sensor glass cell 323 are mutually cancelled. As a result, the laser beam L36, which has passed through the sensor glass cell 323, is a laser beam from which the noise component derived from the sensor glass cell 323 is eliminated.

According to the magnetic field measuring apparatus 30 of the third embodiment, in addition to effects of the magnetic field measuring apparatus 20 of the second embodiment, it is possible to unify the lights (laser beams) used for the magnetic field measurement, thereby using a configuration of a common magnetic field measuring apparatus. That is, it is possible to realize the magnetic field measuring apparatus 30 by adding the respective units 331 to 335 to an existing magnetic field measuring apparatus. Note that, the respective units 331 to 335 and the respective units 341 to 347 may be separate devices. Further, by using the acousto-optic modulator 351 as the light intensity control unit 39, it is not necessary to adjust the frequency or other settings of the light (laser beam) outputted from the light source apparatus 301.

Further, by using the light source apparatus 10 according to the first embodiment as the light source unit 31 (light source apparatus 301), it is possible to have the effect as the light source apparatus 10 of the first embodiment.

<<Fourth Embodiment>>

Figure 9:
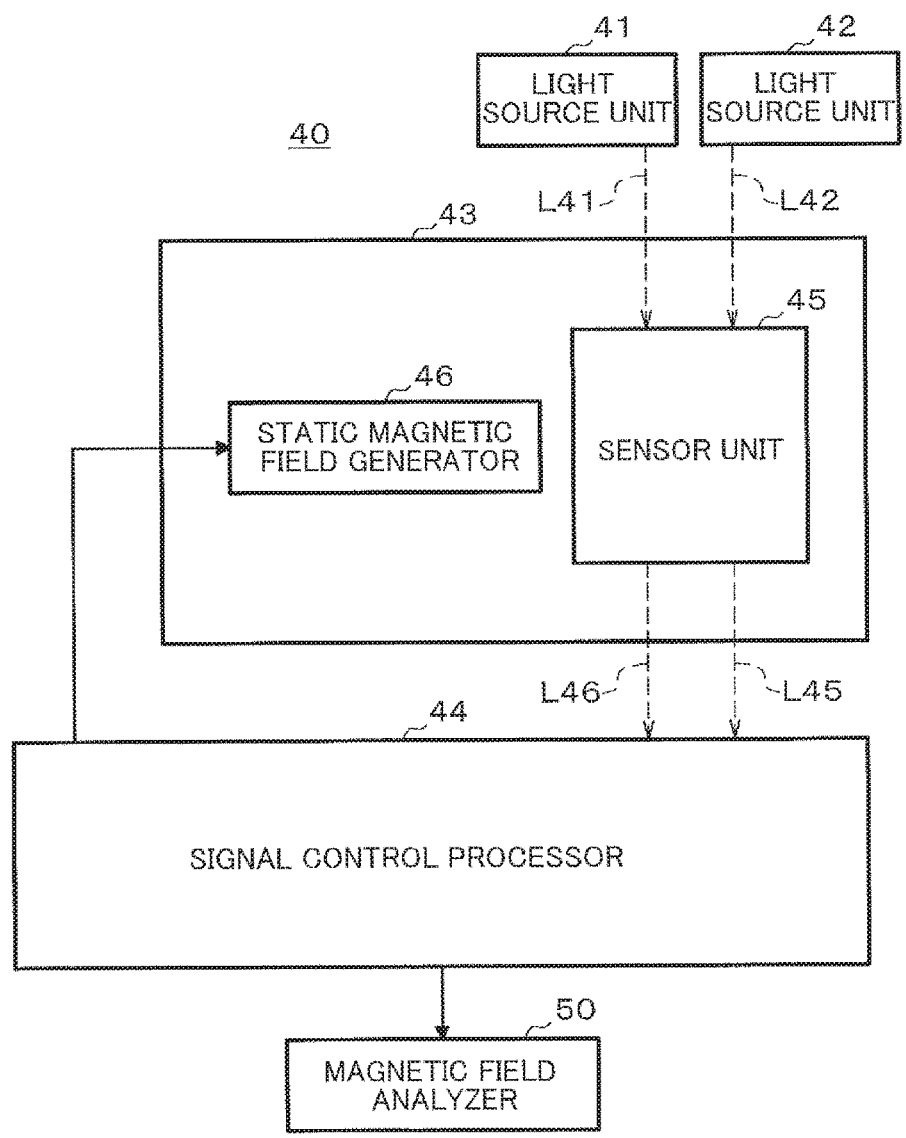
FIG. 9 is a diagram showing a configuration example of a magnetic field measuring apparatus according to a fourth embodiment.

A magnetic field measuring apparatus according to a fourth embodiment will be described with reference to FIGS. 9 to 11. A magnetic field measuring apparatus 40 according to the fourth embodiment detects the magnetic field applied to a sensor unit 45 by an inclination of a polarization plane of a linearly polarized light. FIG. 9 is a diagram showing a configuration example of the magnetic field measuring apparatus according to the fourth embodiment. The magnetic field measuring apparatus 40 includes light source units 41, 42, the sensor unit 45, a static magnetic field generator 46, a signal control processor 44 and the magnetic field analyzer 50. The light source units 41, 42 are for outputting the light L41, L42, and it is desirable to use the light source apparatus 10 of the first embodiment, however, it may not be used.

The sensor unit 45 and the static magnetic field generator 46 are arranged in a magnetic field shield 43. The magnetic field shield 43 is the same as that of the second embodiment, and thus description thereof will be omitted. The static magnetic field by the static magnetic field generator 46 is applied to the sensor unit 45. Further, the measurement object (not shown) is in the vicinity of the sensor unit 45, and the magnetic field generated from the measurement object is also applied to the sensor unit 45. The laser beam L41 outputted from the light source apparatus 41 passes through the sensor unit 45, so as to become laser beams L45, L46 having information of the magnetic field generated from the measurement object. Note that, the laser beam L42 is used for spin-polarizing the alkali metal in the sensor unit 45. These will be described below The signal control processor 44 eliminates the noise derived from the sensor unit 45 based on the laser beams L45, L46 having passed the sensor unit 45. Further, the signal control processor 44 transmits the electrical signal required for the magnetic field analysis to the magnetic field analyzer 50. Further, the signal control processor 44 supplies a constant current to the static magnetic field generator 46. Then, the magnetic field analyzer 50 performs the magnetic field analysis based on the electrical signal, which is transmitted from the signal control processor 44 and is required for the magnetic field analysis. The magnetic field analyzer 50 may be a separate device from the magnetic field measuring apparatus 40.

The magnetic field shield 43, in Which the sensor unit 45 and the static magnetic field generator 46 are arranged, is the same as the second embodiment, and thus description thereof will be omitted here.

Next, each component in FIG. 9 will be described in detail. First, configuration of the magnetic field measuring apparatus 40 will be briefly described with reference to FIGS. 10 and 11, and then detailed function of each component will be described. FIG. 10 is a diagram showing a detailed configuration of the magnetic field measuring apparatus according to the fourth embodiment, and FIG. 11 is a diagram showing a detailed configuration of a sensor device according to the fourth embodiment. As shown in FIG. 10, the magnetic field measuring apparatus 40 has two light source apparatuses 401, 402 which are the light source unit 41, 42. As described above, the light source apparatuses 401, 402 are preferably the light source apparatuses 10 of the first embodiment, but may not be. Further, only the light source apparatus 401 may be the light source apparatus 10 of the first embodiment. Furthermore, a sensor device 411 as the sensor unit 45 and a static magnetic field generator 412 as the static magnetic field generator 46 are arranged in the magnetic field shield 43.

Further, the signal control processor 44 includes two photodetectors (conversion units) 431, 432, a differential amplifier circuit 433 and a filter circuit 434. These functions will be described below.

Figure 10:
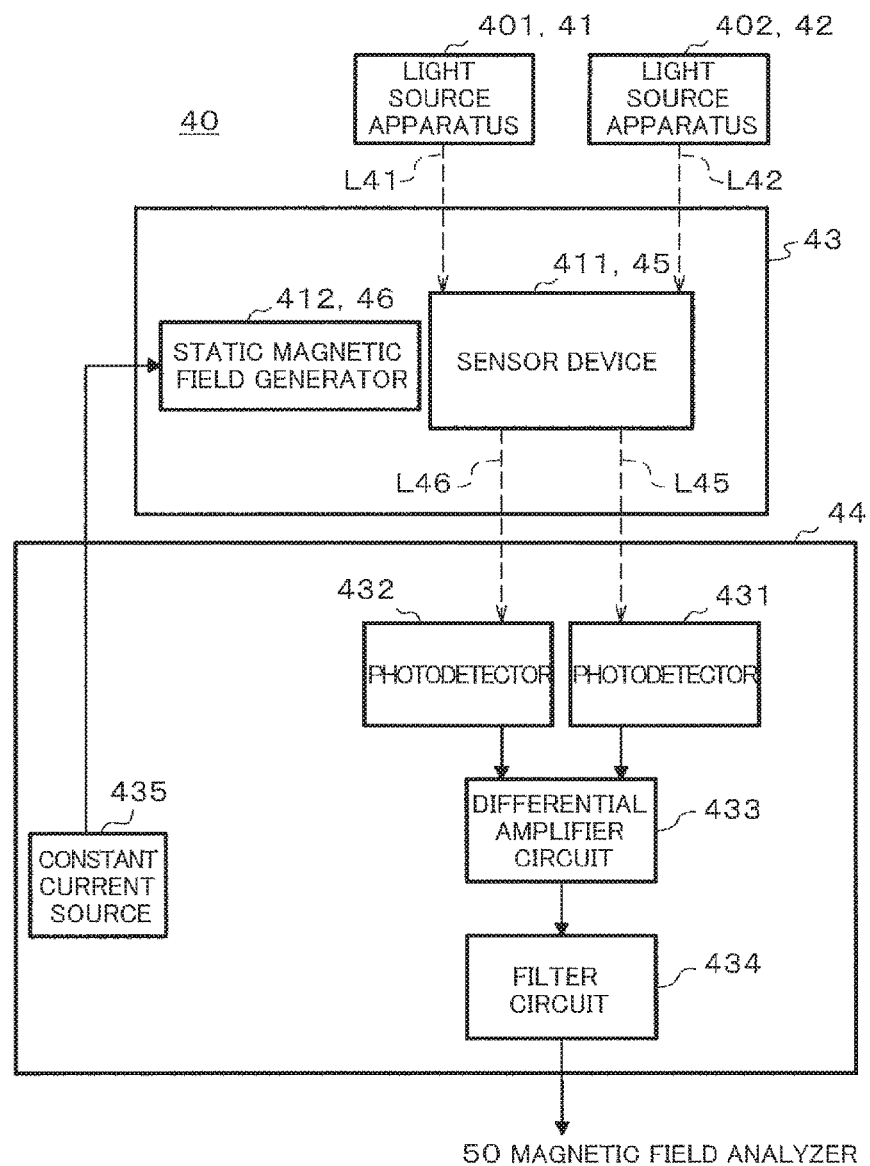
FIG. 10 is a diagram showing a detailed configuration of the magnetic field measuring apparatus according to the fourth embodiment.

As shown in FIG. 10, the sensor device 411 is disposed inside the magnetic field shield 43 along with the measurement object (not shown) which is a magnetic field source. Further, the static magnetic field generator 412, which applies to the sensor device 411 a static magnetic field in a direction perpendicular to optical axes of the laser beam L41, L42, is also disposed inside the magnetic field shield 43.

The static magnetic field generator 412 is a coil and may be, for example, a Helmholtz coil which is disposed sandwiching a sensor glass cell 423 in the sensor device 411. The static magnetic field generator 412 applies a constant static magnetic field to the sensor device 411, since a precisely controlled constant current is supplied from a constant current source 435 provided outside the magnetic field shield 43.

Further, as shown in FIG, 11, the sensor device 411 includes collimating lenses 421, 424, a λ/2 wave plate (linear polarization unit) 422, a λ/4 wave plate (circular polarization unit) the sensor glass cell 423, a polarization beam splitter (splitting unit) 426 and condensing lenses 427, 428. Here, the alkali metal gas is sealed in the sensor glass cell 423.

Hereinafter, function of each device will be described in detail with reference to FIGS. 10 and 11. The laser beam L41 outputted from the light source apparatus 401 (FI(I 10) is a laser beam which contains the wavelength of the absorption line (D1 line or D2 line) of the alkali metal sealed in the sensor glass cell 423 (FIG. 11). Further, the laser beam L42 outputted from the light source apparatus 402 is a laser beam which does not contain the wavelength of the absorption line of the alkali metal. As shown in FIG. 11, traveling directions of the laser beam L41 and the laser beam L42 are different from each other by 90 degrees, and they perpendicularly intersect each other in the sensor glass cell 423. That is, the sensor glass cell 423 is provided in a subsequent stage of the λ/2 wave plate 422 and the λ/4 wave plate 425. Then, the sensor glass cell 423 has the alkali metal gas sealed therein, and a linearly polarized light (laser beam L43) and a circularly polarized light (laser beam L44) are inputted thereto perpendicularly to each other.

Figure 11:
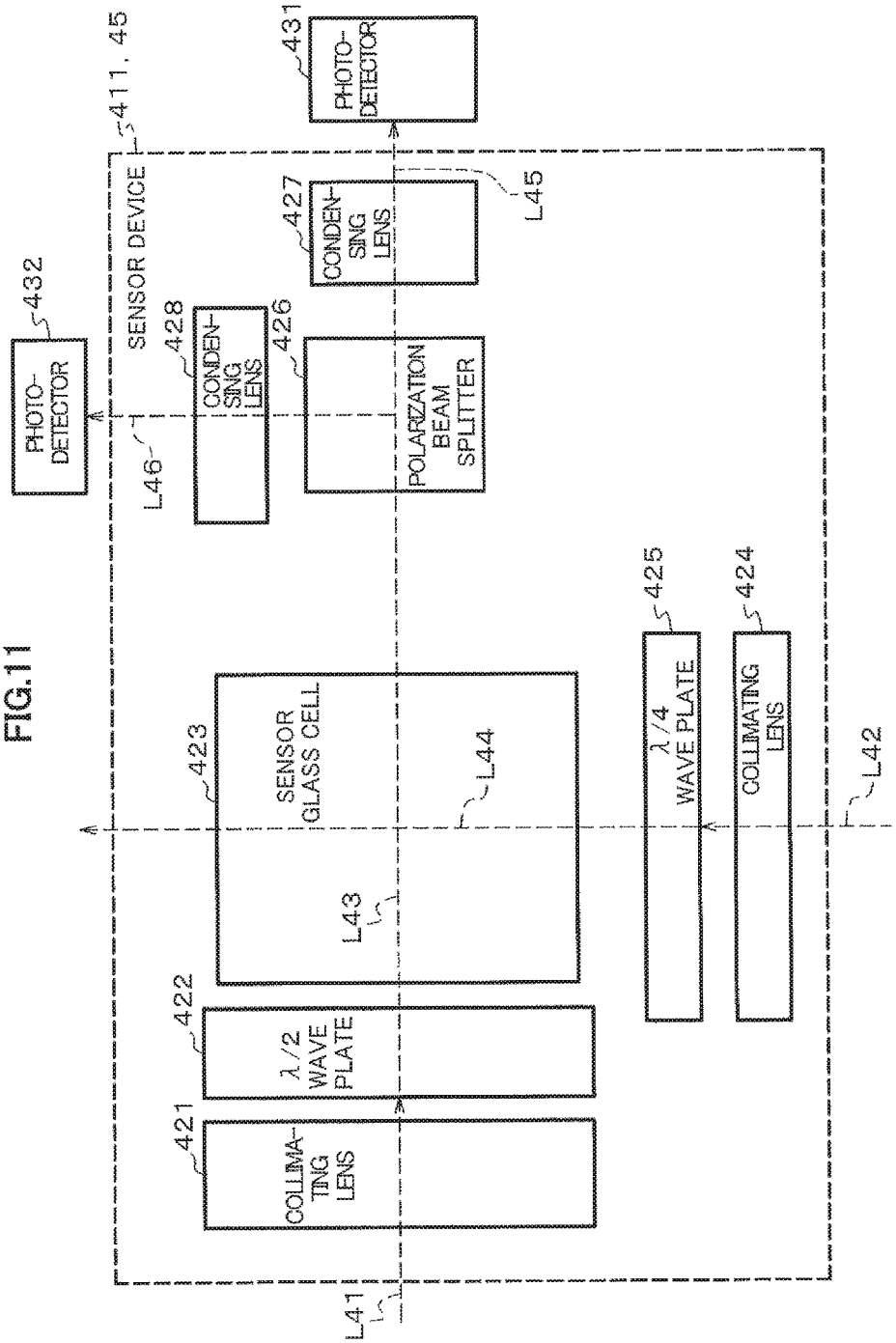
FIG. 11 is a diagram showing a detailed configuration of a sensor device according to the fourth embodiment.

As shown in FIG. 11, the laser beam L42 which is a second light outputted from the light source apparatus 402 (FIG. 10) becomes a parallel light through the collimating lens 424, and then becomes the laser beam L44 of circularly polarized light by the λ/4 wave plate 425, to be inputted into the sensor glass cell 423. The alkali metal atoms inside the sensor glass cell 423 become in a spin-polarized state by the laser beam L44 of circularly polarized light.

Further, the laser beam L41 (probe light) which is a first light outputted from the light source apparatus 401 becomes a parallel light through the collimating lens 421, and then becomes the laser beam L43 of linearly polarized light by the λ/2 wave plate 422, to be inputted into the sensor glass cell 423.

The laser beam L43 of linearly polarized light, which has passed through the sensor class cell 423, is split into the laser beam L45 of left-handed circularly polarized light and the laser light L46 of right-handed circularly polarized light by the polarization beam splitter 426. The laser beam L45 of left-handed circularly polarized light is condensed by the condensing lens 427, and is converted into an electrical signal by the photodetector 431. In the same manner, the laser light L46 of right-handed circularly polarized light is condensed by the condensing lens 428, and is converted into an electrical signal by the photodetector 432.

As shown in FIG. 10, the electrical signals respectively outputted from the photodetectors 431, 432 are calculated in differences by the differential amplifier circuit 433, to be amplified with an appropriate gain. That is, the differential amplifier circuit 433 calculates a difference between the electrical signal converted from the left-handed circularly polarized light (laser beam L45) and the electrical signal converted from the right-handed circularly polarized light (laser light L46). The differential amplifier circuit 433 calculates the difference between the laser beam L45 of left-handed circularly polarized light and the laser light L46 of right-handed circularly polarized light, by calculating a difference between outputs respectively from the photodetectors 431. 432. As a result, by calculating a difference between the circularly polarized lights in the opposite direction to each other, noises in the laser beam L45 of left-handed circularly polarized light and the laser light L46 of right-handed circularly polarized light are cancelled with each other, and the noises derived from the sensor glass cell 423 are cancelled.

The electrical signal outputted from the differential amplifier circuit 433 is processed by the filter circuit 434 in order to extract a signal component of an appropriate signal bandwidth. The electrical signal outputted from the filter circuit 434 reflects inclination fluctuation of the polarization plane of the linearly polarized light corresponding to the magnetic field entering the sensor glass cell 423. Then, the electrical signal outputted from the filter circuit 434 is analyzed by the magnetic field analyzer 50.

According to the magnetic field measuring apparatus 40 of the fourth embodiment, in addition to effects of the magnetic field measuring apparatus 20 of the second embodiment, it is possible to simplify a system.

(Other Examples)

Figure 12:
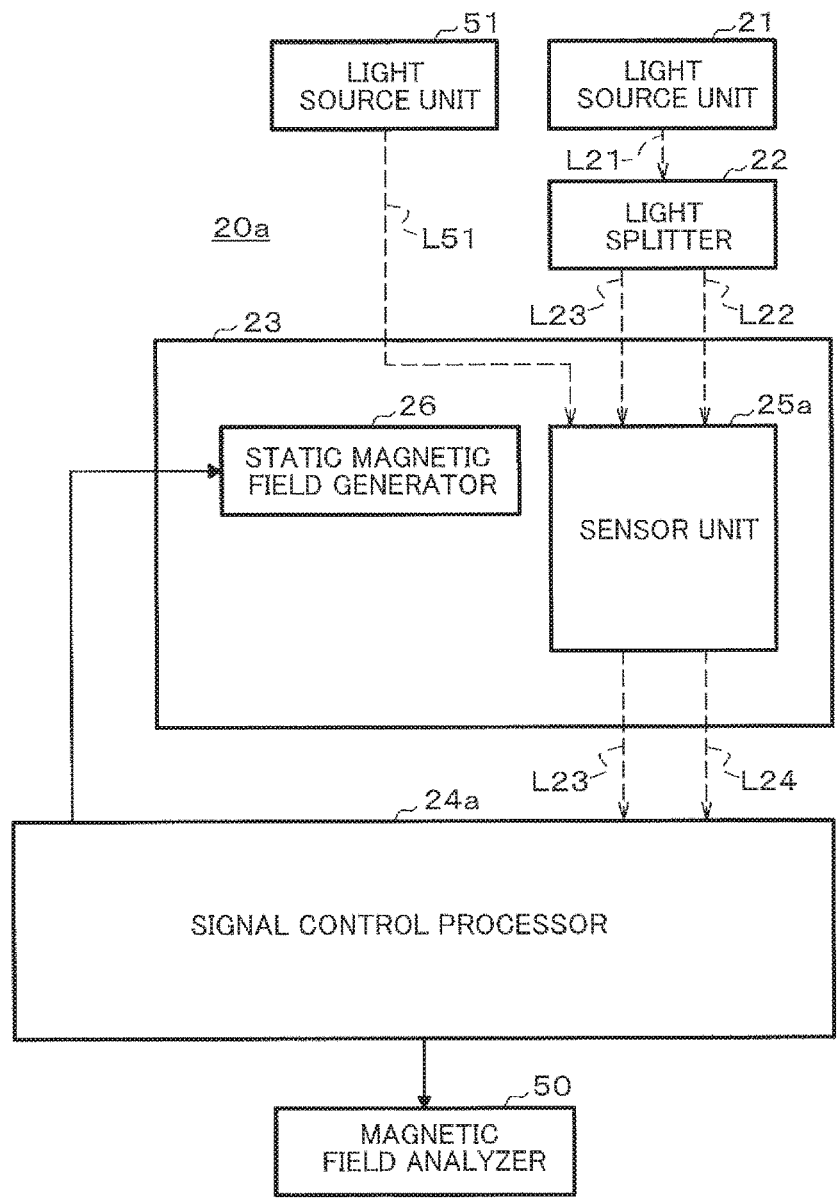
FIG. 12 is a diagram (No. 1) showing another example of a magnetic field measuring apparatus according to the present embodiment.

Note that, as shown in FIG. 12, it may be a magnetic field measuring apparatus 20a in which the RF magnetic field generator 27 is omitted from the magnetic field measuring device 20 in FIG. 3 of the second embodiment. Here, the magnetic field measuring apparatus 20a detects the magnetic field applied to a sensor unit 25a by the inclination of the polarization plane of the linearly polarized light. Therefore, the magnetic field measuring apparatus 20a shown in FIG. 12 has alight source unit 51 for outputting a laser beam L51 separately from the light source unit 21. Further, a signal control processor 24a of the magnetic field measuring apparatus 20a is configured such that the phase detection circuit 235, the loop filter circuit 236 and the oscillator circuit 237 are omitted from the signal control processor 24 in FIG. 4. Then, the sensor unit 25a of the magnetic field measuring apparatus 20a is configured such that the polarization beam splitter 426 is omitted from the configuration in FIG. 11, and the condensing lenses 427, 428 and the photodetectors 431 432 respectively have functions of the condensing lenses 224, 226 and the photodetectors 231, 232 in FIG. 5. Here, the laser beam L51 has the same function as the laser beam L42 in the fourth embodiment.

Figure 13:
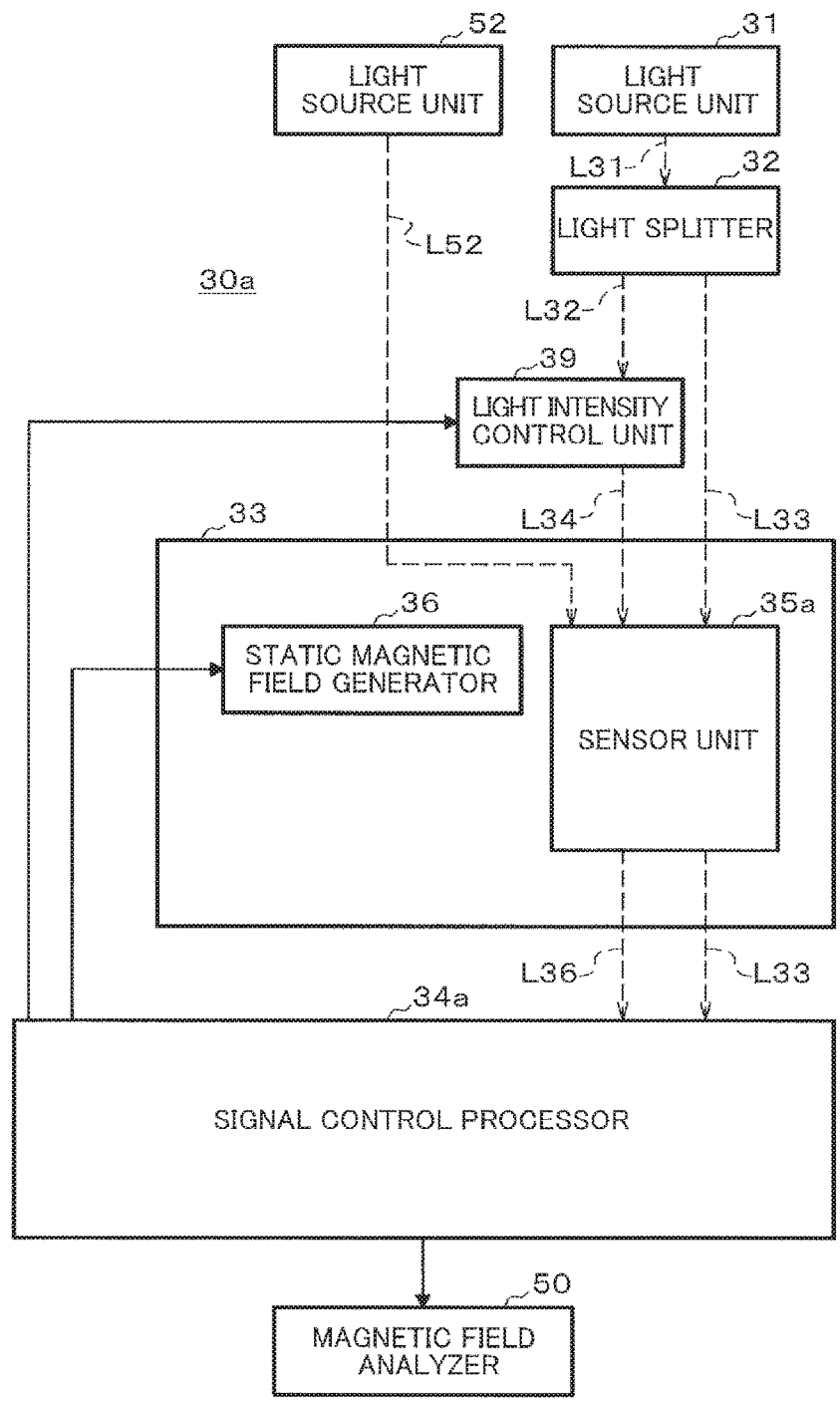
FIG. 13 is a diagram (No. 2) showing another example of the magnetic field measuring apparatus according to the present embodiment.

Further, as shown in FIG. 13, it may be a magnetic field measuring apparatus 30a in which the RF magnetic field generator 37 is omitted from the magnetic field measuring device 30 in FIG. 6 of the third embodiment. Here, the magnetic field measuring apparatus 30a detects the magnetic field applied to a sensor unit 35a by the inclination of the polarization plane of the linearly polarized light. Therefore, the magnetic field measuring apparatus 30a shown in FIG. 13 has a light source unit 52 for outputting a laser beam L52 separately from the light source unit 31. Further, a signal control processor 34a of the magnetic field measuring apparatus 30a is configured such that the phase detection circuit 344, the loop filter circuit 345 and the oscillator circuit 346 are omitted from the signal control processor 34 in FIG. 7. Then, the sensor unit 35a of the magnetic field measuring apparatus 30a is configured such that the polarization beam splitter 426 is omitted from the configuration in FIG. 11, and the condensing lenses 427, 428 and the photodetectors 431, 432 respectively have functions of the condensing lenses 324, 326 and the photodetectors 331, 341 in FIG. 8. Here, the laser beam L52 has the same function as the laser beam L42 in the fourth embodiment.

Further, the RF magnetic field generator may be added to the magnetic field measuring apparatus 40 in FIG. 9 of the third embodiment. In this case, the light source unit 42 is omitted, and the sensor unit and the signal control processor are configured to be the same as those of the second embodiment or of the third embodiment.

The laser beams L22, L23, L24, L33, L34, L36, L41, L42, L43, L44 may be respectively introduced into the sensor glass cells 223, 323, 423 by space propagation, however, are preferably introduced by using optical fibers in consideration of practicality. In this case, it is desirable to use a polarization-maintaining optical fiber in consideration of polarization state stability of the laser beams L23, L24, L33, 36, L42, L43 passing through the optical fiber. Further the laser beams L23, L24, L33, L36, L43, Which have respectively passed the sensor glass cells 223, 323, 423, may also be respectively introduced into the photodetectors 232, 231, 331, 341, 431, 432 by space propagation, however, are preferably introduced by using the optical fibers in consideration of practicality. In this case, it is desirable to use a multi-mode optical fiber having a large core diameter in consideration of coupling efficiency of the optical fiber. The above can also be applied to the reference glass cell 113 of the first embodiment.

The multi-mode optical fiber generally does not have a polarization-maintaining function. However, collapse of the polarization, which is a problem during input into the sensor glass cells 223, 323, 423, is not a problem during photodetection by the photodetectors 231, 232, 331, 341, 431, 432, and thus use of the multi-mode optical fiber does not cause a problem.

Further, the $\lambda/4$ wave plate and the $\lambda/2$ wave plate may be inserted at a connection point between the light source apparatuses 201, 301, 401, 402 and the polarization maintaining optical fibers used for introduction of the laser beams, and may be used for adjusting the polarization plane to the optical axis of the polarization maintaining optical fiber.

The present invention is not limited to the embodiments described above, but includes various modifications. For example, the embodiments described above are for simply describing the present invention in detail, but the present invention is not necessarily limited to the embodiments including all the components described above. Further, it is possible to replace a portion of components of one embodiment by a component of another embodiment, and it is also possible to add a component of one embodiment to components of another embodiment. Furthermore, it is possible to delete a portion of components of each embodiment.

Further, a portion or all of the components 102, 117, 118, 125 to 127, 233 to 237, 333 to 335, 342 to 346 may be implemented by hardware, for example, by integrated circuit design. Further, functions of the components 102, 117, 118, 125 to 127, 233 to 237, 333 to 335, 342 to 346 may be implemented by software, for example, by interpreting and executing programs for realizing respective functions by a processor such as a CPU. It is possible to store information such as files, tables and programs for realizing the respective functions in a HD (Hard Disk), a memory device such as a memory or an SSD (Solid State Drive), or a memory medium such as an IC (Integration circuit) card, an SD (Secure Digital) card or a DVD (Digital Versatile Disc). Further, control lines and information lines, which are considered to be necessary for description, are described in each embodiment, and all the control lines and information lines which are necessary for an actual product are not necessarily described. Actually, almost all of the components may be considered to be connected to each other.

REFERENCE SIGNS LIST 10 light source apparatus
11: laser output unit (light generating unit)
12: frequency stabilization unit
13: drive unit
14: intensity stabilization unit
20, 30, 40: magnetic field measuring apparatus
121, 351: acousto-optic modulator (light intensity fluctuation correction unit, acousto-optic modulation unit)
130: light intensity fluctuation detection circuit (light intensity fluctuation detector)
21, 31, 41, 42 light source unit
22, 32 light splitter
24, 34, 44 signal control processor
25, 35, 45 sensor unit
39 light intensity control unit
127 drive circuit (light intensity fluctuation correction unit, modulation drive unit)
222, 322, 425 $\lambda/4$ wave plate (circular polarization unit)
223, 323, 423 sensor glass cell
231, 232, 331, 341, 431, 432 photodetector (conversion unit)
233, 333, 433 differential amplifier circuit (differential unit)
332 reference voltage circuit (reference voltage unit)
335 drive circuit (drive unit, light intensity fluctuation correction unit)
422 $\lambda/2$ wave plate (linear polarization unit)
426 polarization beam splitter (splitting unit)

The invention claimed is:

1. A magnetic field measuring apparatus comprising:
a sensor unit for passing therethrough a light outputted from a light source unit;
a signal control processor for removing light intensity fluctuation based on two lights passed through the sensor unit;
a light splitter for splitting the light emitted from the light source unit into a first light and a second light; and
a light intensity control unit for superimposing a fluctuation of an electrical signal transmitted from the signal control processor on the first light,
wherein the sensor unit comprises:
  a circular polarization unit which circularly polarizes the first light; and
  a sensor glass cell which is provided in a subsequent stage of the circular polarization unit, while alkali metal gas is sealed therein, and the first light and the second light pass therethrough, and
wherein the signal control processor comprises:
  a conversion unit for converting intensity of the second light passing through the sensor glass cell into an electrical signal;
  a reference voltage unit for supplying a reference voltage;
  a differential unit for calculating a difference value between the reference voltage and a voltage converted by the conversion unit; and
  a drive unit for transmitting fluctuation of the difference value as fluctuation of the electrical signal to the light intensity control unit.

2. The magnetic field measuring apparatus according to claim 1,
wherein the light intensity control unit is an acousto-optic modulator capable of changing light intensity outputted by being applied with voltage, and
wherein the drive unit applies a variation of the voltage having a reversed plus/minus sign of the fluctuation of the electrical signal, to the acousto-optic modulator.

3. A magnetic field measuring apparatus comprising:
a sensor unit for passing therethrough a light outputted from a light source unit;

a signal control processor for removing light intensity fluctuation based on two lights passed through the sensor unit;

wherein the two lights are respectively outputted from light source apparatuses which are different from each other, wherein the sensor unit comprises:
- a linear polarization unit which linearly polarizes a first light out of the two lights;
- a circular polarization unit which circularly polarizes a second light out of the two lights;
- a sensor glass cell, which is provided in a subsequent stage of the linear polarization unit and the circular polarization unit, while alkali metal gas being sealed therein, and the linearly polarized light and the circularly polarized light being inputted thereto perpendicularly to each other; and
- a splitting unit for splitting the first light passing through the sensor glass cell into a right-handed circularly polarized light and a left-handed circularly polarized light, and wherein the signal control processor comprises:
- a conversion unit for respectively converting the right-handed circularly polarized light and the left-handed circularly polarized light into electrical signals; and
- a differential unit for calculating a difference between the electrical signal converted from the right-handed circularly polarized light and the electrical signal converted from the left-handed circularly polarized light.

4. A magnetic field measuring apparatus comprising:
a sensor unit for passing therethrough a light outputted from a light source unit;
a signal control processor for removing light intensity fluctuation based on two lights passed through the sensor unit;

wherein the light source unit comprises:
- a light generating unit for generating and outputting light by being applied with voltage;
- a light intensity fluctuation detector for detecting intensity fluctuation of light outputted from the light generating unit; and
- a light intensity fluctuation correction unit for correcting the light intensity outputted from the light generating unit so as to be constant based on the intensity fluctuation of light detected by the light intensity fluctuation detector;

wherein the light intensity fluctuation correction unit comprises: an acousto-optic modulator capable of changing light intensity outputted from the light generating unit by acousto-optic effect; and a modulation drive unit for driving the acousto-optic modulator, wherein the acousto-optic modulator is inputted with light outputted from the light generating unit, and modulates intensity of the inputted light by the acousto-optic effect, to output the light as 0 order light, wherein the light intensity fluctuation detector detects the intensity fluctuation of light based on the 0 order light outputted from the acousto-optic modulator, and wherein the modulation drive unit controls voltage applied to the acousto-optic modulator based on the intensity fluctuation of light detected by the light intensity fluctuation detector.

5. The magnetic field measuring apparatus according to claim 4,
wherein the light source unit further comprises a frequency stabilization unit for stabilizing frequency of light outputted from the light generating unit.

6. The magnetic field measuring apparatus according to claim 5,
wherein the light intensity fluctuation detector and the light intensity fluctuation correction unit are provided in a subsequent stage of the frequency stabilization unit.

* * * * *